(12) United States Patent
Siemieniec et al.

(10) Patent No.: US 9,799,729 B2
(45) Date of Patent: Oct. 24, 2017

(54) METHOD OF MANUFACTURING A SEMICONDUCTOR DEVICE WITH FIELD ELECTRODE STRUCTURES, GATE STRUCTURES AND AUXILIARY DIODE STRUCTURES

(71) Applicant: Infineon Technologies Austria AG, Villach (AT)

(72) Inventors: Ralf Siemieniec, Villach (AT); Oliver Blank, Villach (AT); Franz Hirler, Isen (DE); Martin Henning Vielemeyer, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 15/400,754

(22) Filed: Jan. 6, 2017

(65) Prior Publication Data

US 2017/0125520 A1  May 4, 2017

Related U.S. Application Data

(63) Continuation of application No. 14/849,106, filed on Sep. 9, 2015, now Pat. No. 9,543,386.

(30) Foreign Application Priority Data

Sep. 12, 2014  (DE) .................. 10 2014 113 189

(51) Int. Cl.
*H01L 21/332* (2006.01)
*H01L 29/06* (2006.01)
(Continued)

(52) U.S. Cl.
CPC ...... *H01L 29/0696* (2013.01); *H01L 29/1095* (2013.01); *H01L 29/401* (2013.01);
(Continued)

(58) Field of Classification Search
CPC ............ H01L 29/0696; H01L 29/7813; H01L 29/407; H01L 29/7397; H01L 29/7806;
(Continued)

(56) References Cited

U.S. PATENT DOCUMENTS 9,543,386 B2 *  1/2017 Siemieniec ......... H01L 29/7396
2009/0218621 A1  9/2009 Pfirsch et al.
(Continued)

FOREIGN PATENT DOCUMENTS

DE  102005052734 A1  4/2007

*Primary Examiner* — Thien F Tran
(74) *Attorney, Agent, or Firm* — Murphy, Bilak & Homiller, PLLC

(57) ABSTRACT

A method of manufacturing a semiconductor device includes: forming field electrode structures extending in a direction vertical to a first surface in a semiconductor body; forming cell mesas from portions of the semiconductor body between the field electrode structures, including body zones forming first pn junctions with a drift zone; forming gate structures between the field electrode structures and configured to control a current flow through the body zones; and forming auxiliary diode structures with a forward voltage lower than the first pn junctions and electrically connected in parallel with the first pn junctions, wherein semiconducting portions of the auxiliary diode structures are formed in the cell mesas.

20 Claims, 27 Drawing Sheets

(51) Int. Cl.
    *H01L 29/10*     (2006.01)
    *H01L 29/40*     (2006.01)
    *H01L 29/739*     (2006.01)
    *H01L 29/78*     (2006.01)
    *H01L 29/872*     (2006.01)
    *H01L 29/66*     (2006.01)
    *H02M 3/335*     (2006.01)
    *H02M 1/088*     (2006.01)

(52) U.S. Cl.
    CPC ...... *H01L 29/407* (2013.01); *H01L 29/66348* (2013.01); *H01L 29/66734* (2013.01); *H01L 29/7397* (2013.01); *H01L 29/7806* (2013.01); *H01L 29/7813* (2013.01); *H01L 29/872* (2013.01); *H02M 1/088* (2013.01); *H02M 3/33576* (2013.01)

(58) Field of Classification Search
    CPC .......... H01L 29/1095; H01L 29/66348; H01L 29/66734; H01L 29/401; H01L 29/872; H02M 1/088; H02M 3/33576
    USPC ........................................................ 438/133
    See application file for complete search history.

(56) References Cited

U.S. PATENT DOCUMENTS

| | | |
|---|---|---|
| 2010/0301410 A1 | 12/2010 | Hirler |
| 2012/0049270 A1 | 3/2012 | Hirler et al. |
| 2014/0145206 A1 | 5/2014 | Siemieniec et al. |
| 2015/0144988 A1 | 5/2015 | Laven et al. |
| 2015/0144989 A1 | 5/2015 | Seo et al. |
| 2015/0162407 A1 | 6/2015 | Laven et al. |
| 2015/0179636 A1 | 6/2015 | Pfirsch et al. |

\* cited by examiner

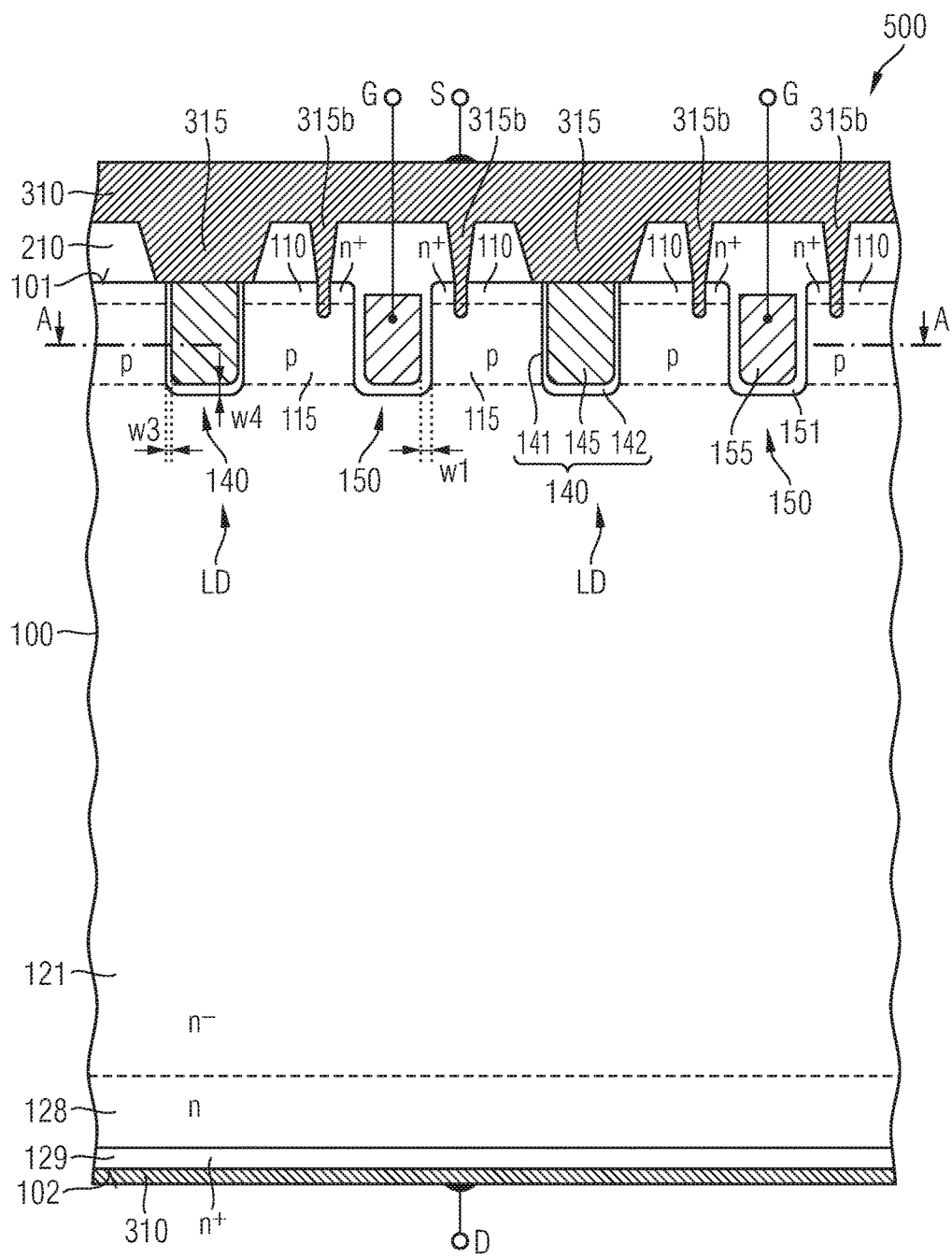

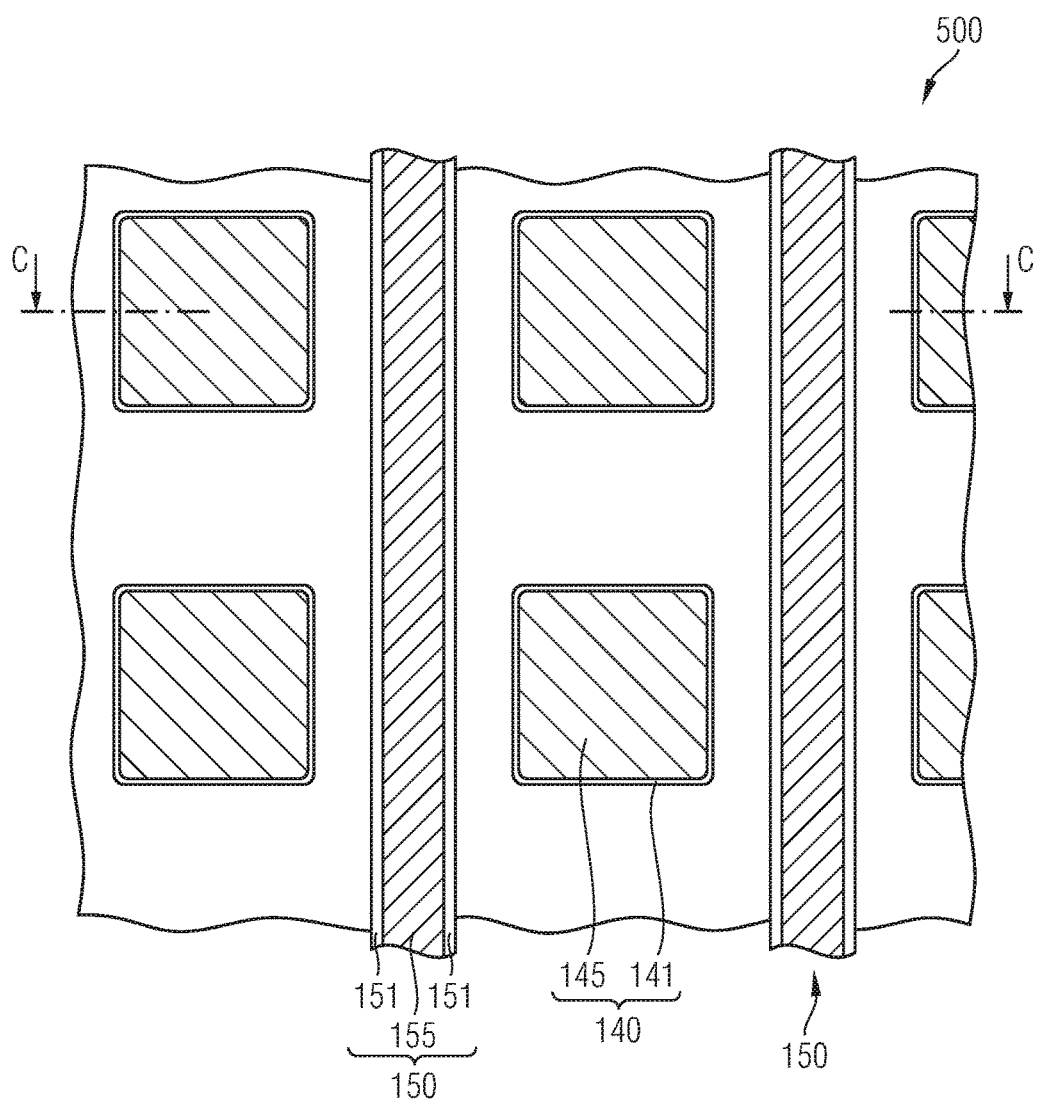

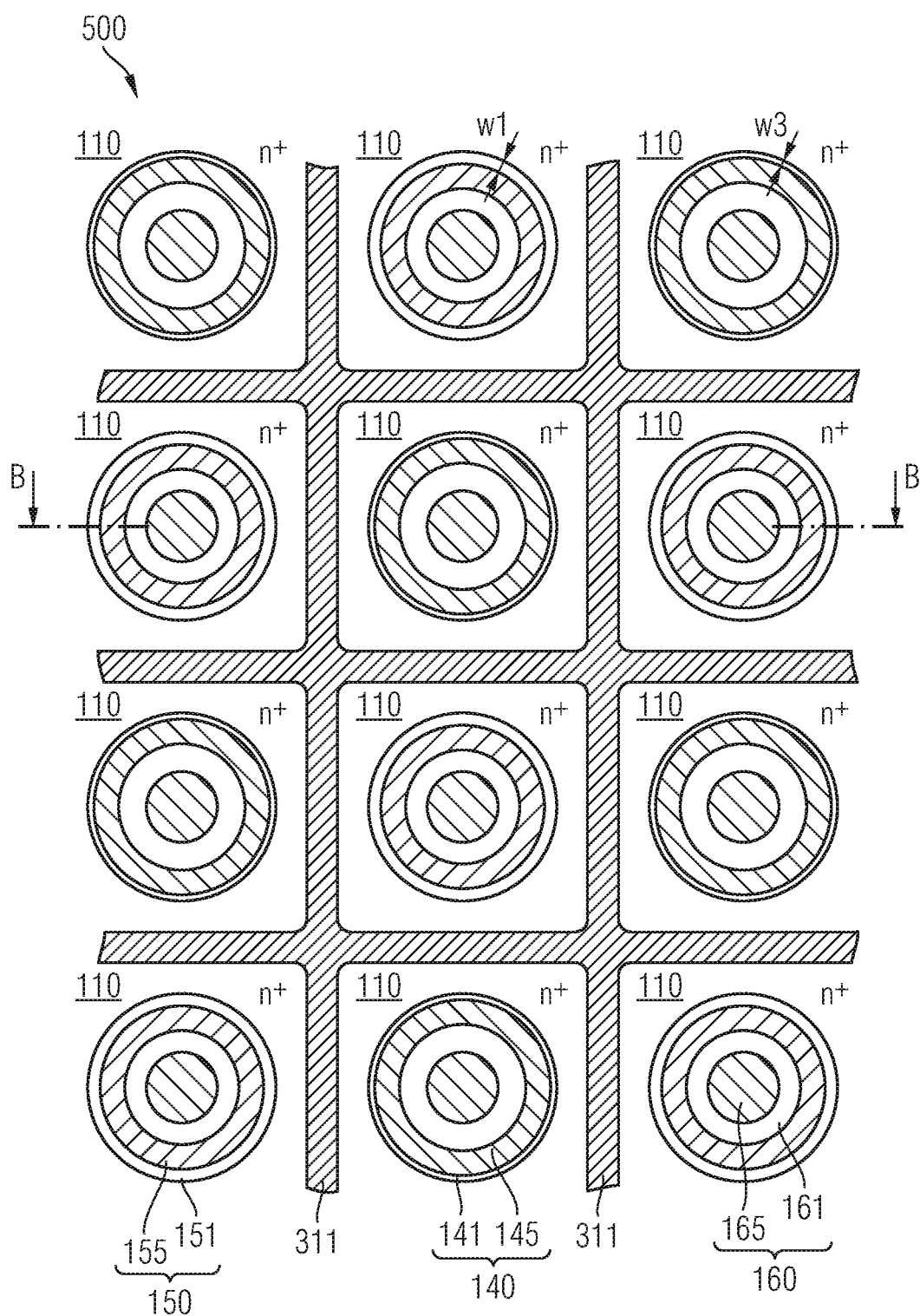

US 9,799,729 B2

METHOD OF MANUFACTURING A SEMICONDUCTOR DEVICE WITH FIELD ELECTRODE STRUCTURES, GATE STRUCTURES AND AUXILIARY DIODE STRUCTURES

PRIORITY CLAIM

This application is a continuation of U.S. patent application Ser. No. 14/849,106 filed on 9 Sep. 2015, which in turn claims priority to German Patent Application No. 10 2014 113 189.4 filed on 12 Sep. 2014, the content of said application incorporated herein by reference in its entirety.

BACKGROUND

Power semiconductor devices used as switching devices typically include IGFET (insulated gate field effect transistor) cells. In a forward mode, a suitable potential at a gate electrode induces an inversion channel through a body zone. The inversion channel bypasses a reverse biased pn junction between the body zone and a drift zone. In a reverse blocking mode compensation structures extending from the front side into the semiconductor die deplete semiconductor mesas between. the compensation structures such that the semiconductor mesas may have higher dopant concentrations without adverse impact on the blocking capability. High dopant concentrations in turn reduce the on-state resistance of the semiconductor device. Typical switching applications for power semiconductor devices include a switching cycle with the pn junction between the body zone and the drift zone being forward biased and conveying a switching current. A voltage drop across the forward biased pn junction between body zone and drift zone significantly contributes to the total switching losses in the semiconductor device in switching applications.

It is desirable to provide semiconductor devices with low switching losses.

SUMMARY

According to an embodiment a semiconductor device includes field electrode structures extending in a direction vertical to a first surface in a semiconductor body. Cell mesas are formed from portions of the semiconductor body between the field electrode structures and include body zones that form first pn junctions with a drift zone. Gate structures between the field electrode structures control a current flow through the body zones. Auxiliary diode structures with a forward voltage lower than the first pn junctions are electrically connected in parallel with the first pn junctions, wherein semiconducting portions of the auxiliary diode structures are formed in the cell mesas.

According to another embodiment an electronic assembly includes a semiconductor device including field electrode structures extending in a direction vertical to a first surface in a semiconductor body. Cell mesas are formed from portions of the semiconductor body between the field electrode structures and include body zones that form first pn junctions with a drift zone. Gate structures between the field electrode structures control a current flow through the body zones. Auxiliary diode structures with a forward voltage lower than the first pn junctions are electrically connected in parallel with the first pn junctions. Semiconducting portions of the auxiliary diode structures are formed in the cell mesas.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 6C is a schematic vertical cross-sectional view of the semiconductor device portion of FIG. 6A along line C-C.

FIG. 8A is a schematic horizontal cross-sectional view of a portion of a semiconductor device in accordance with an embodiment related to stripe-shaped gate structures and MGDs with diode electrodes formed in the vertical projection of field electrode structures.

FIG. 9A is a schematic horizontal cross-sectional view of a portion of a semiconductor device according to an embodiment related to MGDs and gate electrode structures formed in field electrode trenches, respectively.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the append-ing claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element (a) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
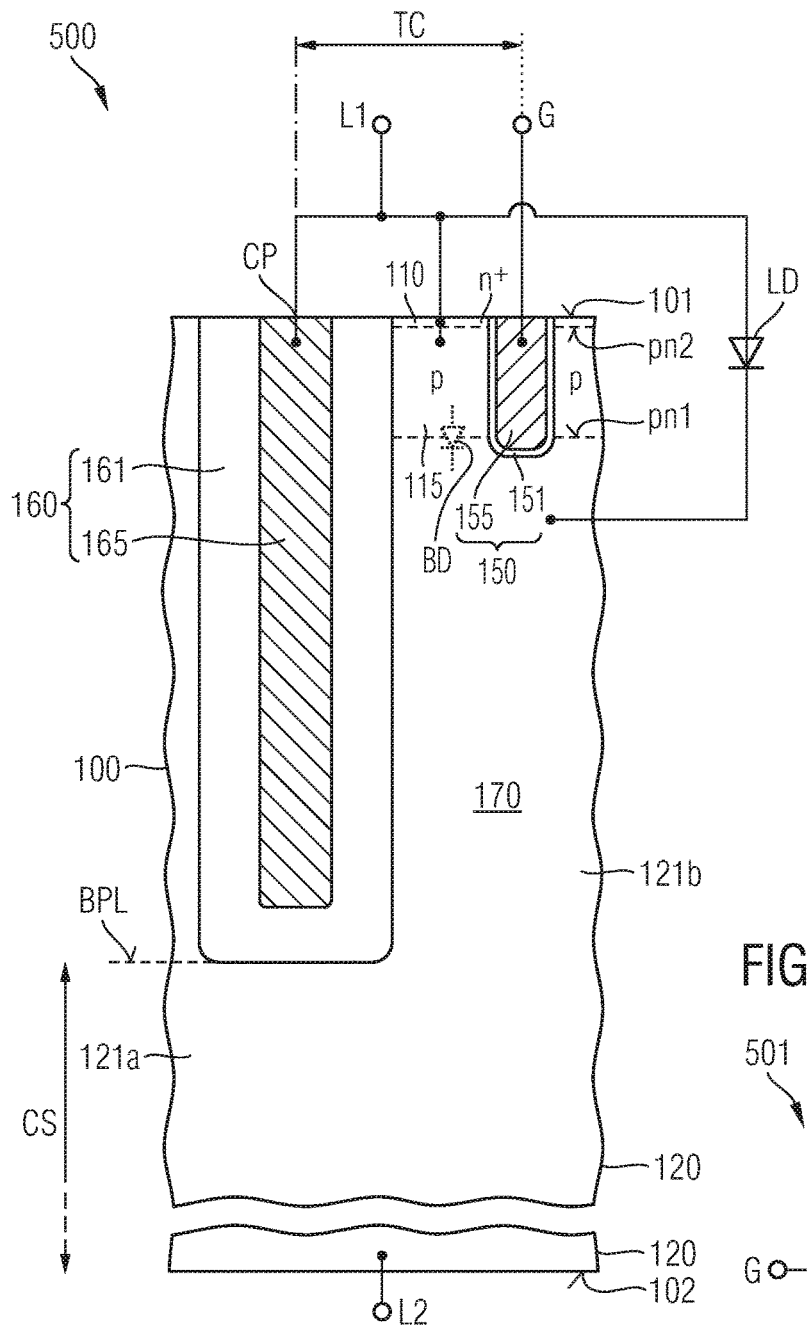
FIG. 1A is a schematic vertical cross-sectional view of a portion of a semiconductor device according to an embodiment related to auxiliary diode structures which semiconducting portions are formed in cell mesas between gate and field electrode structures.
Figure 1B:
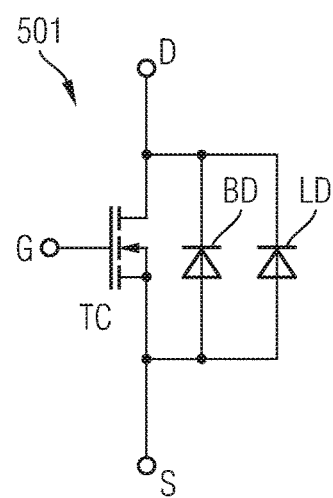
FIG. 1B is a schematic circuit diagram of an IGFET cell illustrated in FIG. 1A.

FIGS. 1A to 1B refer to a semiconductor device 500 including a plurality of identical IGFET (insulated gate field effect transistor) cells TC. The semiconductor device 500 may be or may include a reverse-conducting power IGFET, for example a power MOSFET (metal oxide semiconductor FET) in the usual meaning including FETs with metal gates as well as FETs with non-metal gates. According to another embodiment, the semiconductor device 500 may be an IGBT.

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

At a front side the semiconductor body 100 has a first surface 101 which may be approximately planar or which may be defined by a plane spanned by coplanar surface sections. A planar second surface 102 at an opposite rear side of the semiconductor body 100 extends parallel to the first surface 101. A distance between the first and second surfaces 101, 102 is a function of the voltage blocking capability and may be at least 20 μm. According to other embodiments, the distance may be in the range of up to, e.g., 250 μm. A lateral surface, which is tilted to the first and second surfaces 101, 102 connects the first and second surfaces 101, 102.

In a plane parallel to the first surface 101 the semiconductor body 100 may have a rectangular shape with an edge length of several millimeters. A normal to the first surface 101 defines a vertical direction and directions orthogonal to the vertical direction are horizontal directions.

Each transistor cell IC includes a field electrode structure 160 extending from the first surface 101 into the semiconductor body 100 down to a bottom plane BPL. Each field-electrode structure 160 is effective as a compensationstructure and includes a conductive spicular or needleshapedfield electrode 165 and a field dielectric 161 surrounding the field electrode 165.

The field electrode 165 includes or consists of a doped polycrystalline silicon layer and/or a metal-containing layer. The field dielectric 161 separates the field electrode 165 from the surrounding semiconductor material of the semiconductor body 100 and may include or consist of a thermally grown silicon oxide layer. According to an embodiment, the field dielectric 161 may include or consist of a deposited silicon oxide layer, e.g., a silicon oxide layer based on TEOS (tetraethyl orthosilicate).

A vertical extension of the field electrode structures 160 is smaller than a distance between the first surface 101 and the second surface 102 such that a contiguous section CS of the semiconductor body 100 is formed between the field electrode structures 160 and the second surface 102. The vertical extension of the field electrode structures 160 may be in a range from 0.2 µm to 45 µm, for example in a range from 2 µm to 20 µm. The contiguous section CS includes a first drift zone section 121a of a first conductivity type.

A first horizontal extension of the field electrode 165 may be at most three times or at most twice as large as a second horizontal extension orthogonal to the first horizontal extension. The horizontal extensions may be in a range from 0.1 µm to 2 µm, for example in a range from 0.15 µm to 1 µm.

The horizontal cross-sections of the field electrodes 165 and the field electrode structures 160 may be ellipses, ovals, rectangles, or regular or distorted polygons, with or without rounded or chamfered corners, respectively. According to an embodiment, the first and second horizontal extensions are approximately equal and the cross-sectional areas of the field electrodes 165 and the field electrode structures 160 are circles or regular polygons such as octagons, hexagons or squares, with or without rounded or chamfered corners, respectively.

The field electrode structures 160, which may be centered on a horizontal center point CP of the respective transistor cell TC, may be equally spaced and may be arranged matrix-like in lines and rows. According to other embodiments, the field electrode structures 160 may be arranged in shifted lines, wherein odd lines are shifted with respect to even lines by half the center-to-center distance between two field electrode structures 160 along the line.

Cell mesas 170 protruding from the contiguous section CS of the semiconductor body 100 form semiconducting portions of the transistor cells TC, surround the field electrode structures 160 and form a grid with the field electrode structures 160 arranged in the meshes.

The cell mesas 170 include second drift zone sections 121b of the first conductivity type, wherein the second drift zone sections 121b directly adjoin the first drift zone section 121a in the contiguous section CS of the semiconductor body 100. A dopant concentration in the second drift zone section 121b may be equal to a dopant concentration in the first drift zone section 121a. A mean dopant concentration in a drift zone 121 including the first and second drift zone sections 121a, 121b may be between 1E15 cm$^{-3}$ and 1E17 cm$^{-3}$, for example in a range from 5E15 cm$^{-3}$ to 5E16 cm$^{-3}$, by way of example.

Each cell mesa 170 includes a body zone 115 of a second conductivity type opposite to the first conductivity type and forms a first pn junction pn1 with the drift zone 121. The body zones 115 separate source zones 110 of the first conductivity type from the drift zone 121 and form second pn junctions pn2 with the source zones 110, which are formed between the first surface 101 and the body zones 115. Gate structures 150 extend from the first surface 101 into the cell mesas 170. Each gate structure 150 includes a conductive gate electrode 155, which is completely insulated against the semiconductor body 100. A gate dielectric 151 separates the gate electrode 155 at least from the body zone 115.

The gate electrode 155 includes or consists of a heavily doped polycrystalline silicon layer and/or a metal-containing layer. The gate dielectric 161 may include or consist of a thermally grown silicon oxide layer or a deposited silicon oxide layer, by way of example. A vertical extension of the gate structures 150 is smaller than a vertical extension of the field electrode structures 160. According to an embodiment, the vertical extension of the gate structures 150 may be in a range from 200 nm to 2000 nm, for example in a range from 600 nm to 1000 nm.

The gate dielectric 151 capacitively couples the gate electrode 155 to a channel portion of the body one 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

The gate structure 150 may be a lateral gate formed outside the semiconductor body 100 along the first surface 101. According to the illustrated embodiment the gate structure 150 is a trench gate extending from the first surface 101 into the semiconductor body 100.

The gate electrode 155 may be electrically connected to a gate terminal G of the semiconductor device 500 or to an output of an internal gate driver. The source and body zones 110, 115 may be electrically connected to a first load terminal L1 of the semiconductor device 500, which may be the source terminal of an IGFET or the emitter terminal of an IGBT, by way of example. The field electrode 165 may be electrically connected to the first load electrode L1, to the gate terminal G, to an output of an internal electronic circuit or to a further control terminal of the semiconductor device 500. A drift and rear side structure 120 including the drift zone 121 may be electrically connected to a second load terminal 12, which may be the drain terminal of an IGFET or the collector terminal of an IGBT, by way of example.

In the illustrated embodiments and for the following description, the first conductivity type is n-type and the second conductivity type is p-type. Similar considerations as outlined below apply also to embodiments with the first conductivity type being p-type and the second conductivity type being n-type.

When a voltage applied to the gate electrode 155 exceeds a preset threshold voltage, electrons accumulate in the channel portions directly adjoining the gate dielectric 151 and form inversion channels short-circuiting the second pn junction pn2 for electrons.

The first pn junction pn1 forms a body diode BD which is forward biased when the semiconductor device 500 is reverse biased with a positive voltage applied between the first load terminal L1 and the second load terminal L2. For example, in half bridge circuits, typically two semiconductor switching devices are electrically arranged in series between a DC (direct current) or an AC (alternating current) power supply and the network node between the two semiconductor devices is electrically connected to an inductive load. The semiconductor devices 500 are alternatingly switched on and off, wherein for a short period of time both semiconductor devices are switched off to avoid a short circuit condition. In the common off-time a current induced by the load keeps flowing through the forward biased body diode BD. In case of a semiconductor body 100 of single-crystalline silicon, a forward voltage drop across the body diode BD is typically about 0.7 V.

The semiconductor device 500 includes auxiliary diode structures ED which semiconducting portions are completely formed in the cell mesa 170. The auxiliary diode structures LD have a lower forward voltage drop than the body diode BD at and below an absolute maximum current rating the semiconductor device 500 is specified for. The auxiliary diode structures LD may be Schottky contacts or MGD (MOS gated diode) cells.

FIG. 1B refers to an embodiment concerning an IGFET 501 with a transistor cell TC. The auxiliary diode structure LD is electrically connected in parallel to the body diode BD of the transistor cell TC and governs a voltage drop across the body pn junction pn1. The auxiliary diode structure LD decreases the voltage drop induced by the load in the reverse-biased mode of the semiconductor device 500 and, as a result., the losses in switching applications with long reverse-biased switching phases of the IGFET 501. Since the semiconducting portions of the auxiliary diode structures LD are formed within the cell mesas 170, the auxiliary diode structures LD occupy no additional chip area and hence do not adversely affect the on-state characteristic. Since the auxiliary diode structures LD may be formed in all or at least a plurality of cell mesas 170 the ampacity of the auxiliary diode structures LC in total is comparatively high.

FIGS. 2A to 3C refer to embodiments based on Schottky-diodes SC which semiconducting portions are formed in portions of the cell mesas 170 between the field electrode structures 160 and the gate structures 150.

Figure 2A:
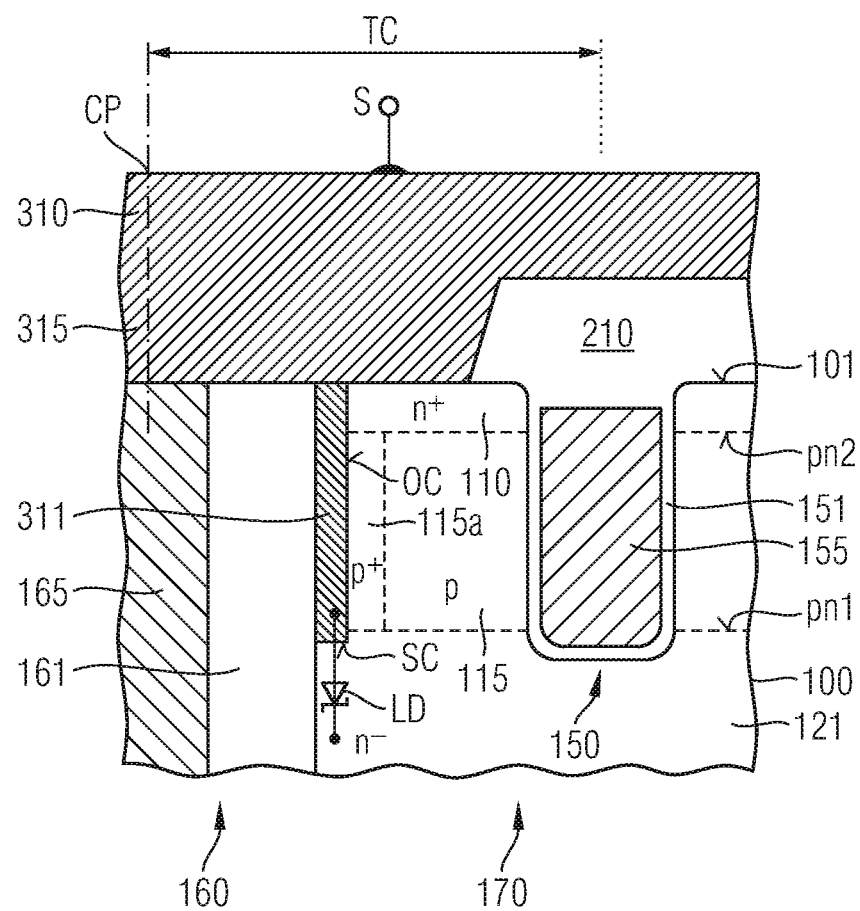
FIG. 2A is a schematic vertical cross-sectional view of a portion of a semiconductor device according to an embodiment related to a Schottky diode formed in a cell mesa and directly adjoining field electrode structure.
Figure 2A:
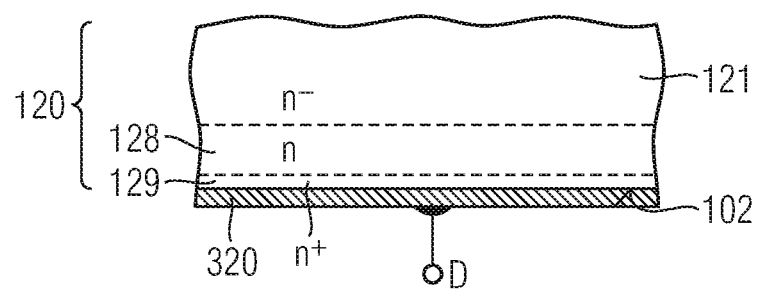

The semiconductor device 500 of FIG. 2A is based on a semiconductor body 100 with field electrode structures 160 separated by cell mesas 170 and gate structures 150 extending from a first surface 101 into the cell mesas 170 as described in detail with reference to FIGS. 1A and 1B.

The semiconductor device 500 is an IGFET with a drift and rear side structure 120 including a heavily doped contact portion 129 of the first conductivity type formed along the second surface 102. The contact portion 129 may be a heavily doped base substrate or a heavily doped layer. Along the second surface 102 a dopant concentration in the contact portion 129 is sufficiently high to form an ohmic contact with a metal directly adjoining the second surface 102. In case the semiconductor body 100 is based on silicon, in an n-conductive contact portion 129 the dopant concentration along the second surface 102 may be at least $1E18 cm^{-3}$, for example at least $5E19 cm^{-3}$, whereas in a p-conductive contact portion 129 the dopant concentration may be at least $1E18 cm^{-3}$, for example at least $5E18 cm^{-3}$.

A field stop layer 128 may separate the drift zone 121 from the contact portion 129. A mean dopant concentration in the field stop layer 128 may be at least five times as high as a mean dopant concentration in the drift zone 121 and a most one fifth of a maximum dopant concentration in the contact portion 129.

in the drift zone 121 a dopant concentration may gradually or in steps increase or decrease with increasing distance to the first surface 101 at least in portions of its vertical extension. According other embodiments, the dopant concentration in the drift zone 121 may be approximately uniform. A mean dopant concentration in the drift zone 121 may be between $1E15 cm^{-3}$ and $1E17 cm^{-3}$, for example in a range from $5E15 cm^{-3}$ to $5E16 cm^{-3}$. The semiconductor body 100 may include further doped regions in the drift zone 121 and the field stop layer 128.

The source zones 110 may be wells extending from the first surface 101 into the cell mesas 170. According to an embodiment, one source zone 110 surrounds the field electrode structure 160 of a transistor cell TC in a horizontal plane. The source zone(s) 110 may directly adjoin the respective field electrode structure 160 or may be spaced from the field electrode structure 160. According to other embodiments, the field electrode structure 160 of the concerned transistor cell TC is not completely surrounded by one source zone 110 or includes several spatially separated source zones 110 arranged rotational symmetric with respect to the horizontal center point of the transistor cell TC.

The gate structure 150 may be stripe-shaped, wherein the stripes extend between lines of needle-shaped field electrode structures 160. According to other embodiments, the gate structure 150 forms a grid with the meshes of the grid comprising one or more field electrode structures 160, respectively. The width of the gate structures 150 may be constant or may vary, such that the distance between the field electrode structure 160 and the gate structure 150 is approximately constant along the circumference of the transistor cell TC.

An interlayer dielectric 210 adjoining the first surface 101 may electrically insulate the gate electrode 155 from a first load electrode 310 arranged at the front side. In addition, the interlayer dielectric 210 may be formed in the vertical projection of the field electrode structures 160.

The interlayer dielectric 210 may include one or more dielectric layers from silicon oxide, silicon nitride, silicon oxynitride, doped or undoped silicate glass, for example BSG (boron silicate glass), PSG (phosphorus silicate class) or BPSG (boron phosphorus silicate glass), by way of example.

The first load electrode 310 may form or may be electrically coupled or connected to a source terminal S in case the semiconductor device 500 is an IGFET. A second load electrode 320, which directly adjoins the second surface 102 and the contact portion 129, may form or may be electrically connected to a second load terminal, which may be the drain terminal D in case the semiconductor device 500 is an IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a suicide, a nitride and/or an alloy.

Contact structures 315 extend through openings in the interlayer dielectric 210 and electrically connect the first load electrode 310 with at least the source zones 110, and, optionally, with the field electrodes 165 of the transistor cells TC. The contact structures 315 may include one or more conductive metal-containing layers based on, e.g., titanium (Ti) or tantalum (Ta) and a metal fill portion, e.g., based on tungsten (W).

According to other embodiments the field electrodes 165 may be electrically connected or coupled to the gate electrode 155, to a further control terminal of the semiconductor device 500, to an output of an internal driver circuit, or may electrically float.

A conductive structure 311, e.g., a highly conductive structure such as a metal structure, may extend from the contact structure 315 into the cell mesa 170. The conductive structure 311 is electrically connected to the source terminal S. For example, the conductive structure 311 directly adjoins the contact structure 315 or the first load electrode 310.

A vertical extension of the conductive structure 311 may be greater than the distance between the first surface 101 and the first pn junction pn1 forming the body diode such that the conductive structure 311 and the drift zone 121 form a metal-semiconductor interface. The conductive structure 311 may directly adjoin the field electrode structure 160 such that it is sandwiched between the cell mesa 170 and the field electrode structure 160.

The interface between the conductive structure 311 and the drift zone 121 may be a metal-semiconductor interface and forms a Schottky contact SC. The Schottky contact SC forms an auxiliary diode structure LD with the forward voltage at and below a nominal maximum forward current of the body diode lower than the forward voltage of the body diode.

The body zone 115 may include a heavily doped contact section 115a extending along at least a portion of the conductive structure 311 such that the conductive structure 311 in addition forms an ohmic contact OC with the body zone 115. In a blocking state of the Schottky contact SC the field electrode structure 160 shields the Schottky contact SC against electric fields and reduces a field induced leakage current of the Schottky contact SC, which is a function of the maximum electric field strength at the Schottky contact SC.

In addition, the gate structure 150 contributes to a reduction of the leakage current, since in the blocking mode of the Schottky contact SC the gate potential is typically the same as at that at the first load electrode 310 and the field electrode 165.

Figure 2B:
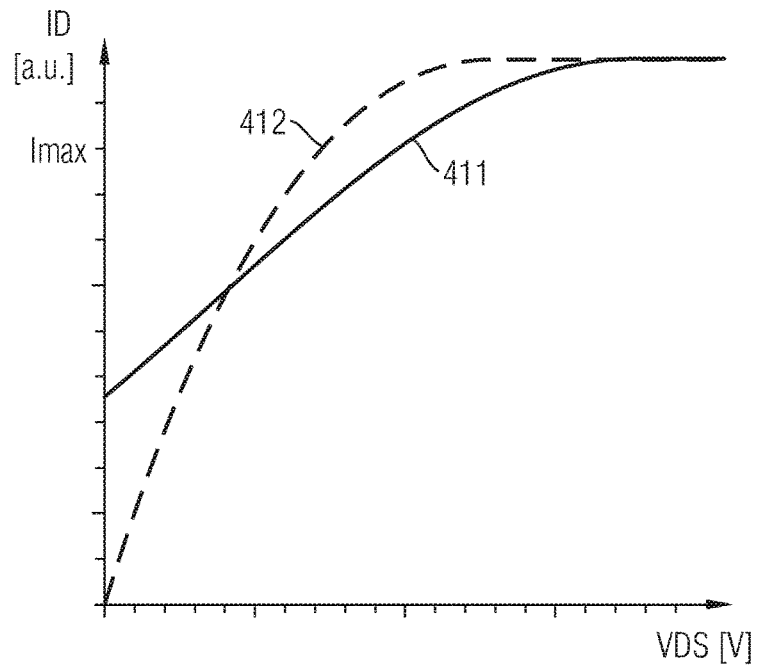
FIG. 2B is a schematic diagram showing forward characteristics of semiconductor devices for discussing effects of the embodiments.

As illustrated in FIG. 2B the forward characteristic 411 of the effective body diode in the semiconductor device 500 of FIG. 2A shows the Schottky characteristic. At and below a maximum diode current Imax specified for the semiconductor device 500, a forward voltage drop across the effective body diode is lower than according to forward characteristic 412 of a reference example without Schottky contact SC.

Figure 2C:
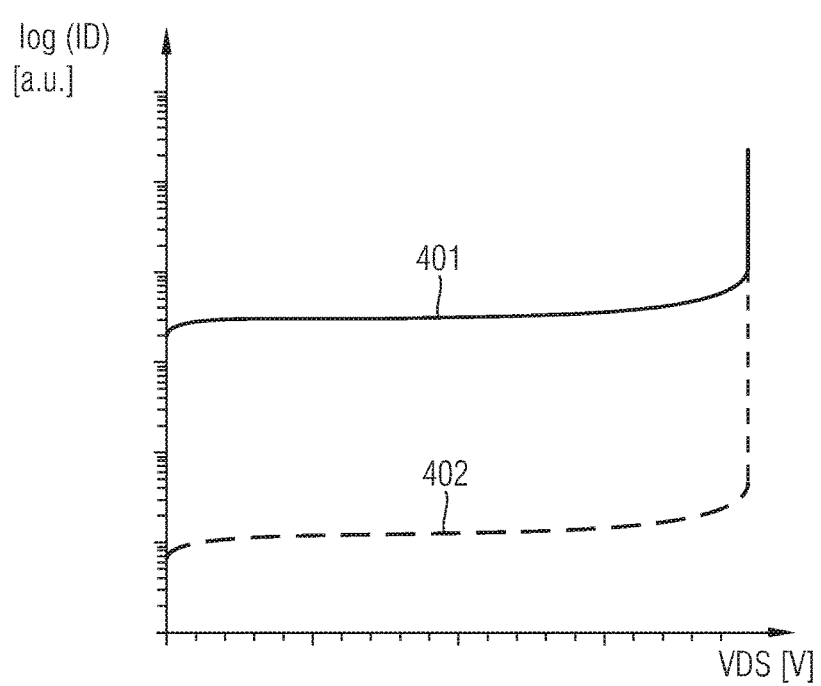
FIG. 2C is a schematic diagram showing blocking characteristics of semiconductor devices for discussing effects of the embodiments.

In FIG. 2C the blocking characteristic 401 of the semiconductor device 500 of FIG. 2A shows a higher leakage current than the blocking characteristic 402 of a reference example without the conductive structure 311 at the same drain-to-source voltage VDS.

Figure 3A:
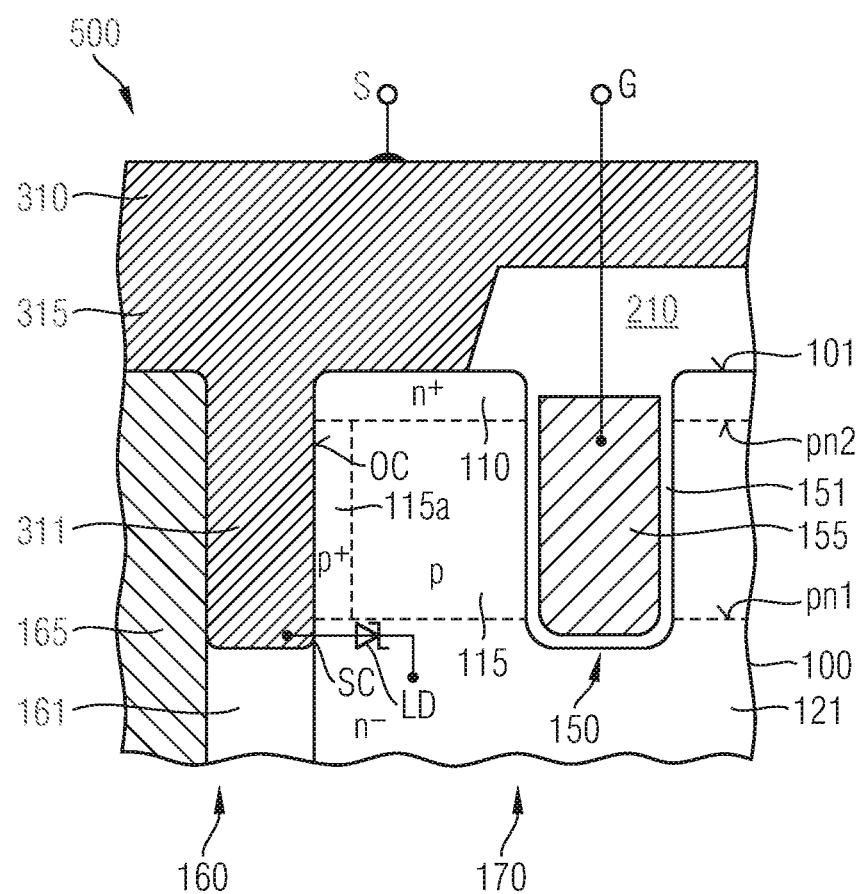
FIG. 3A is a schematic vertical cross-sectional view of a portion of a semiconductor device according to an embodiment related to a Schottky contact formed along a cell mesa and directly adjoining a field electrodes.

In FIG. 3A the conductive structure 311 of the semiconductor device 500 is formed in the vertical projection of a recessed portion of the field dielectric 161 between the recessed field dielectric portion and a plane coplanar with the first surface 101. The conductive structure 311 may be formed self-aligned with respect to the field electrode 165 and the cell mesa 170 by a selective oxide etch after forming an opening in the interlayer dielectric 210. The vertical extension of the buried conductive structure 311 is greater than a distance between the first pn junction pn1 and the first surface 101. The conductive structure 311 overlaps with the drift zone 121 by at least 30 nm and not more than 500 nm.

Figure 3B:
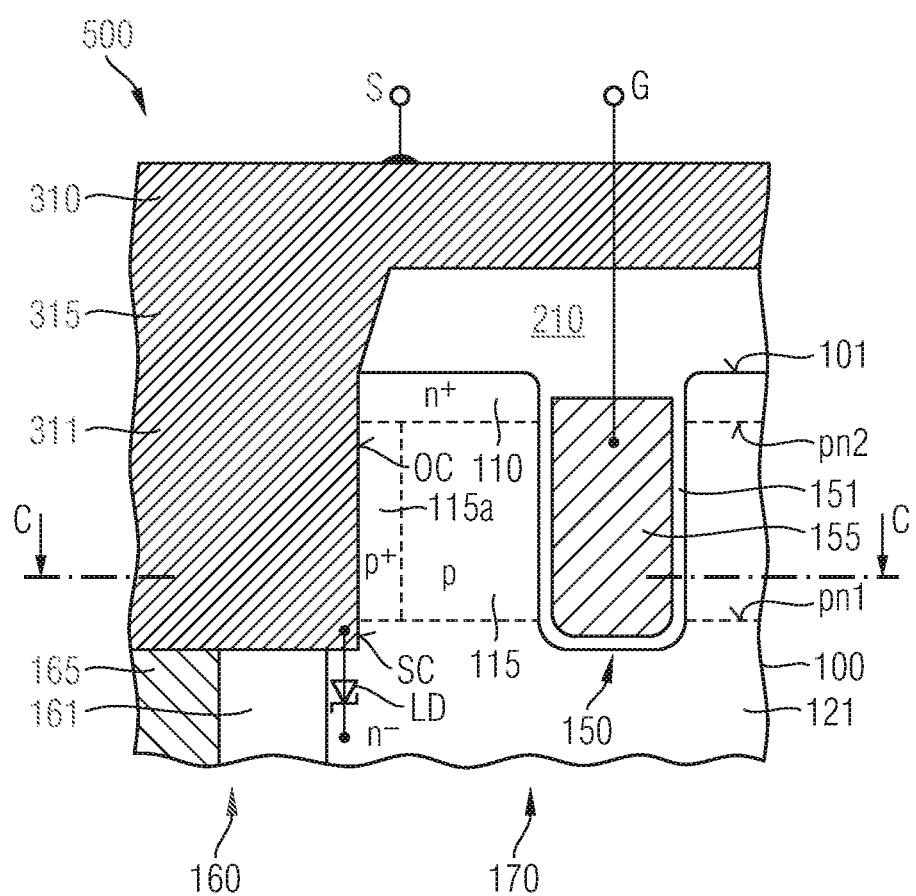
FIG. 3B is a schematic vertical cross-sectional view of a portion of a semiconductor device in accordance with an embodiment related to a Schottky contact based on a conductive structure between a first surface of a semiconductor body and the field electrode structure.

In FIG. 3B the conductive structure 311 separates the buried field electrode structure 160 from a plane coplanar with the first surface 101.

Figure 3C:
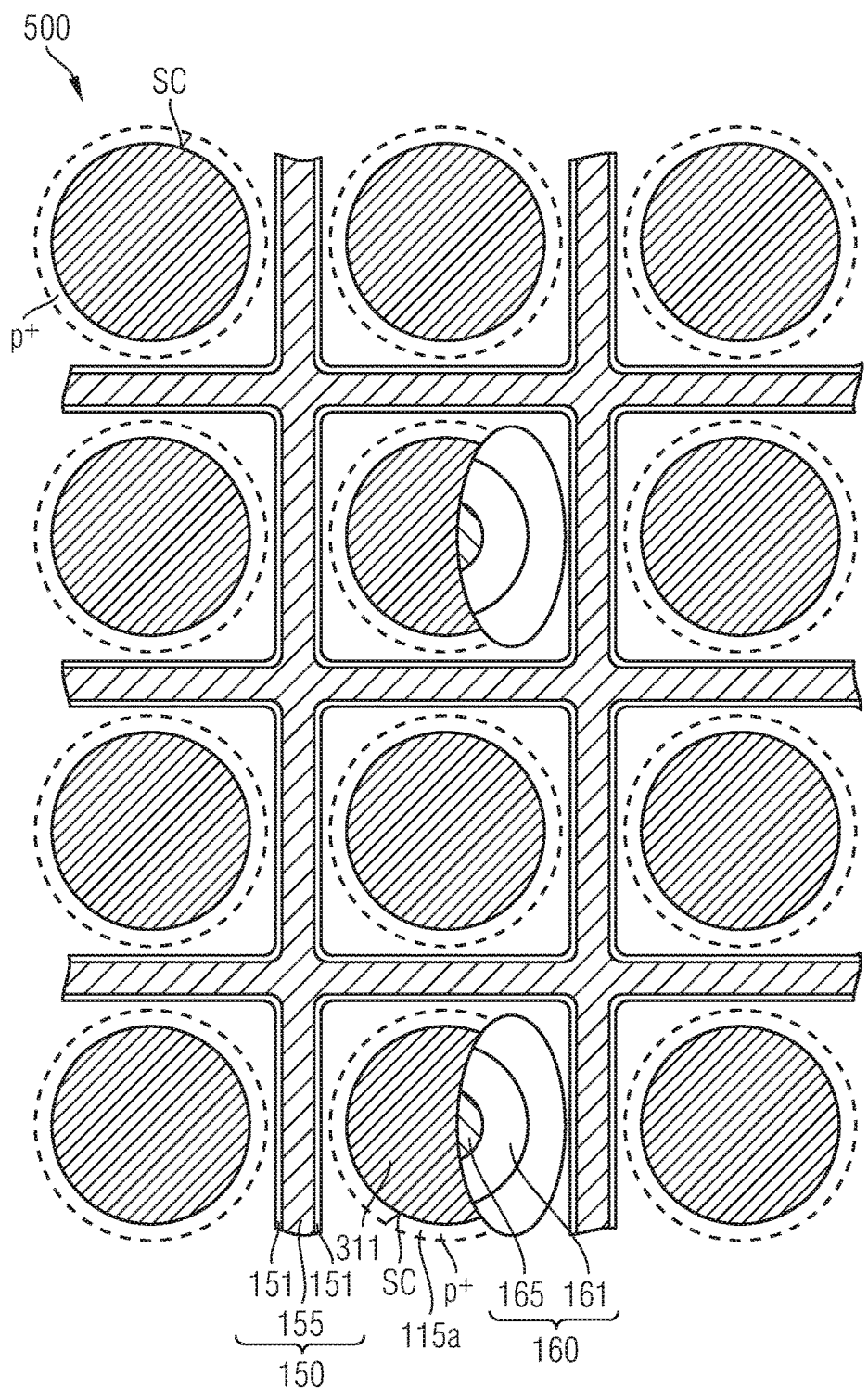
FIG. 3C is schematic horizontal cross-sectional view of the semiconductor device portion of FIG. 3B along line C-C.

FIG. 3C illustrates a layout with a plurality of needle-shaped field electrode structures 160 and circumferential Schottky contacts SC as shown in FIG. 3B. The gate structure 160 forms a grid. The field electrode structures 160 are formed in meshes of the grid. A first lateral extension of the field electrode structures 160 along a first horizontal direction parallel to the first surface 101 is at most three times as large as a second lateral extension of the field electrode structures 160 along a second horizontal direction orthogonal to the first horizontal direction and parallel to the first surface 101. According to an embodiment the first and second lateral extensions are approximately equal, wherein horizontal cross-sectional areas of the field electrode structures 160 may be circles or regular polygons such as squares, hexagons or octagons with or without beveled or rounded corners. The field electrode structures 160 may be arranged in a checkerboard pattern in orthogonal rows and lines. According to other embodiments, the field electrode structures 160 may be arranged in parallel, shifted lines, e.g., in lines shifted to each other by half the center-to-center distance of the field electrode structures 160.

Figure 3D:
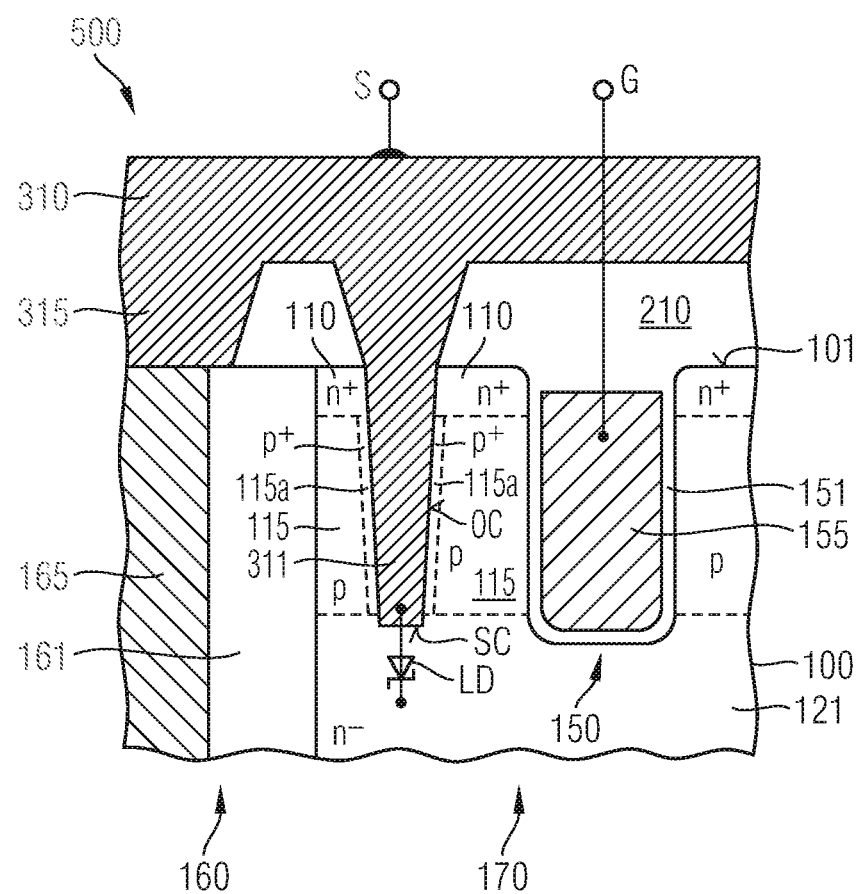
FIG. 3D is a schematic vertical cross-sectional view of a portion of a semiconductor device in accordance with an embodiment related to a Schottky contact formed at a tip of a conductive structure spaced from field electrode and gate structures and extending into the cell mesa.

FIG. 3D refers to a semiconductor device 500 with a conductive structure 311 spaced from both the gate structure 150 and the field electrode structure 160 in the horizontal directions. The conductive structure 311 extends through the source and body zones 110, 115 at least down to the first pn junction pn1. According to the illustrated embodiment the conductive structure 311 extends into the drift zone 121.

The further embodiments refer to MGDs 140 used as auxiliary diode structures LD providing a forward voltage lower than the forward voltage of the body diodes BD formed by the first pn junctions pn1. Auxiliary diode structures LD based on Schottky contacts SC and auxiliary diode structures LD formed as MGDs 140 may be combined in the same semiconductor device 500.

Figure 4A:
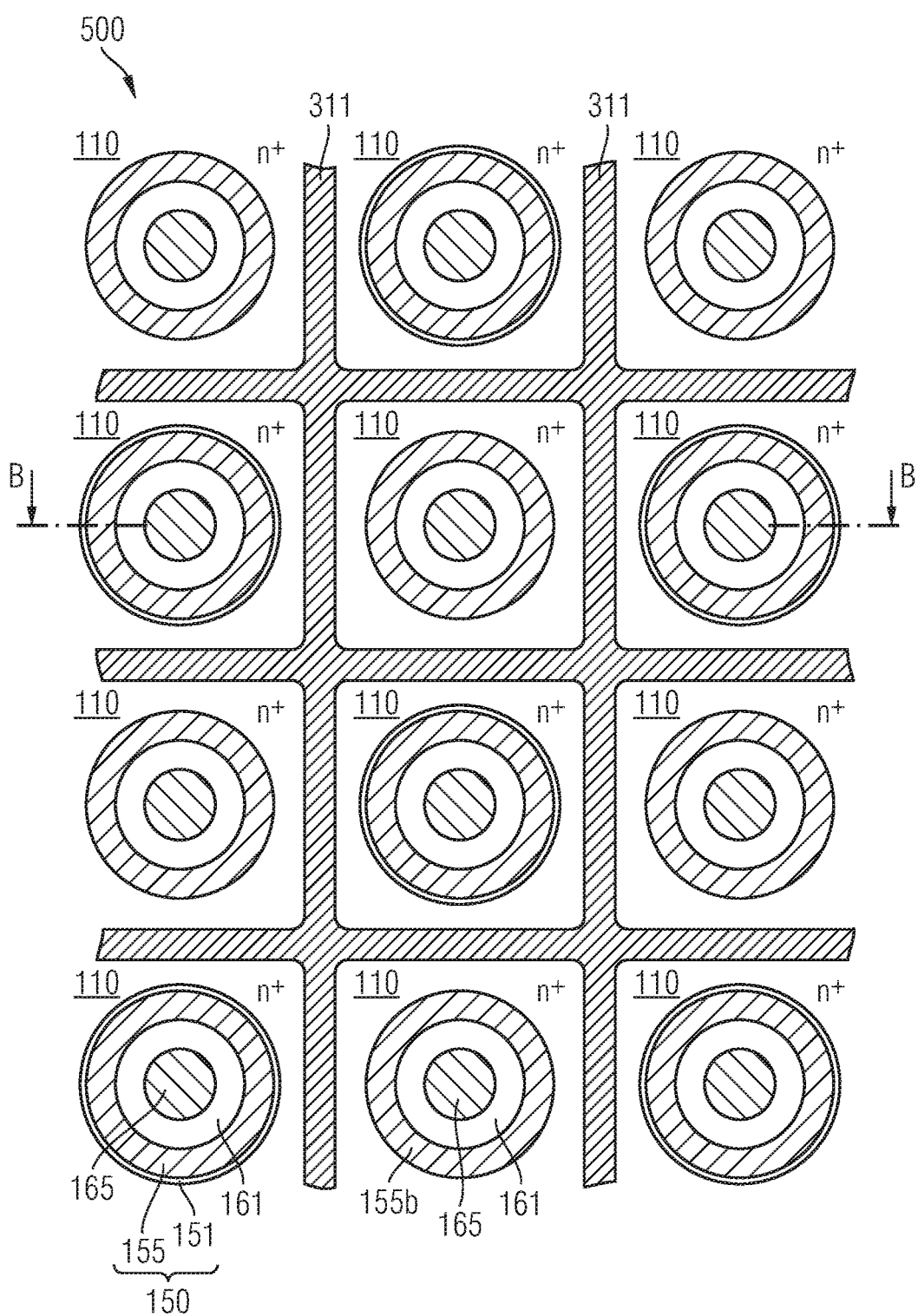
FIG. 4A is a schematic horizontal cross-sectional view of a portion of a semiconductor device according to an embodiment related to Schottky contacts and gate electrodes formed in field electrode trenches, respectively.
Figure 4B:
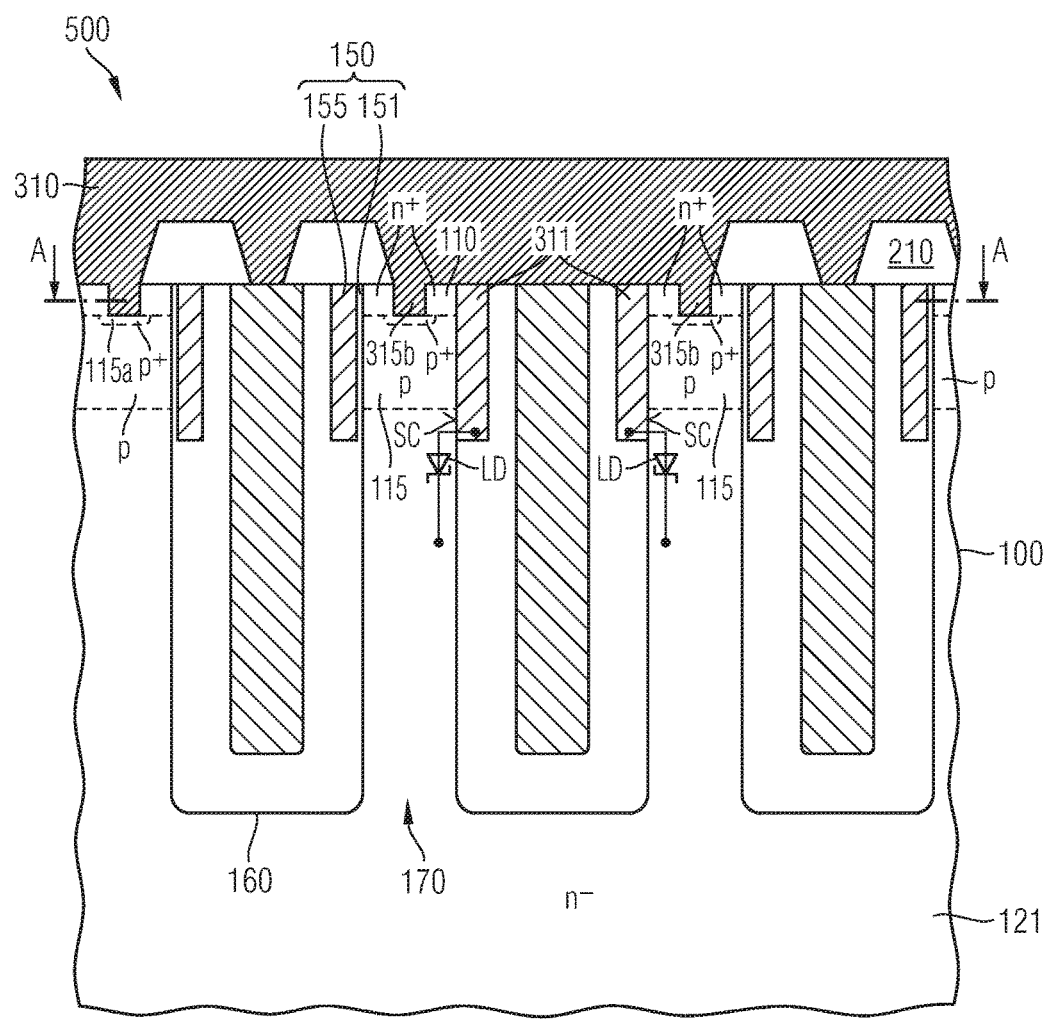
FIG. 4B is a schematic vertical cross-sectional view of the semiconductor device portion of FIG. 4A along line B-B.

While the preceding embodiments refer to embodiments with the gate electrode structures 150 formed in a distance to the field electrode structures 160, FIGS. 4A and 4B refer to an embodiment with both the gate structures 150 and the Schottky contacts SC formed between the cell mesas 170 and the field electrode structures 160, respectively.

The Schottky contacts SC are formed at interfaces between the drift zone 121 and conductive structures 311 that extend from the first surface 101 into the field dielectric 161 of the respective field electrode structure 160. The conductive structures 311 may be provided from a metal containing layer or doped polycrystalline silicon. According to another embodiment, the conductive structures 311 include a metal portion at the interface to the drift, zone 121 and a doped, e.g., heavily doped polycrystalline silicon portion in the rest.

The vertical extension of the gate electrodes 155 and the conductive structures 311 may be approximately equal. Contact structures 315b may extend from the first surface 101 into the semiconductor body 100 to electrically connect the source and body zones 110, 115 with the first load electrode 310. According to another embodiment the conductive structures 311 may electrically connect the source and body zones 110, 115 with the first load electrode 310.

The ratio of field electrode structures 160 with and without Schottky contacts SC may be in range from 1000:1 to 1:10. The illustrated embodiment refers to a ratio of 1:1 with the field electrode structures 160 with and without Schottky contacts SC arranged in a checkerboard pattern.

Figure 5A:
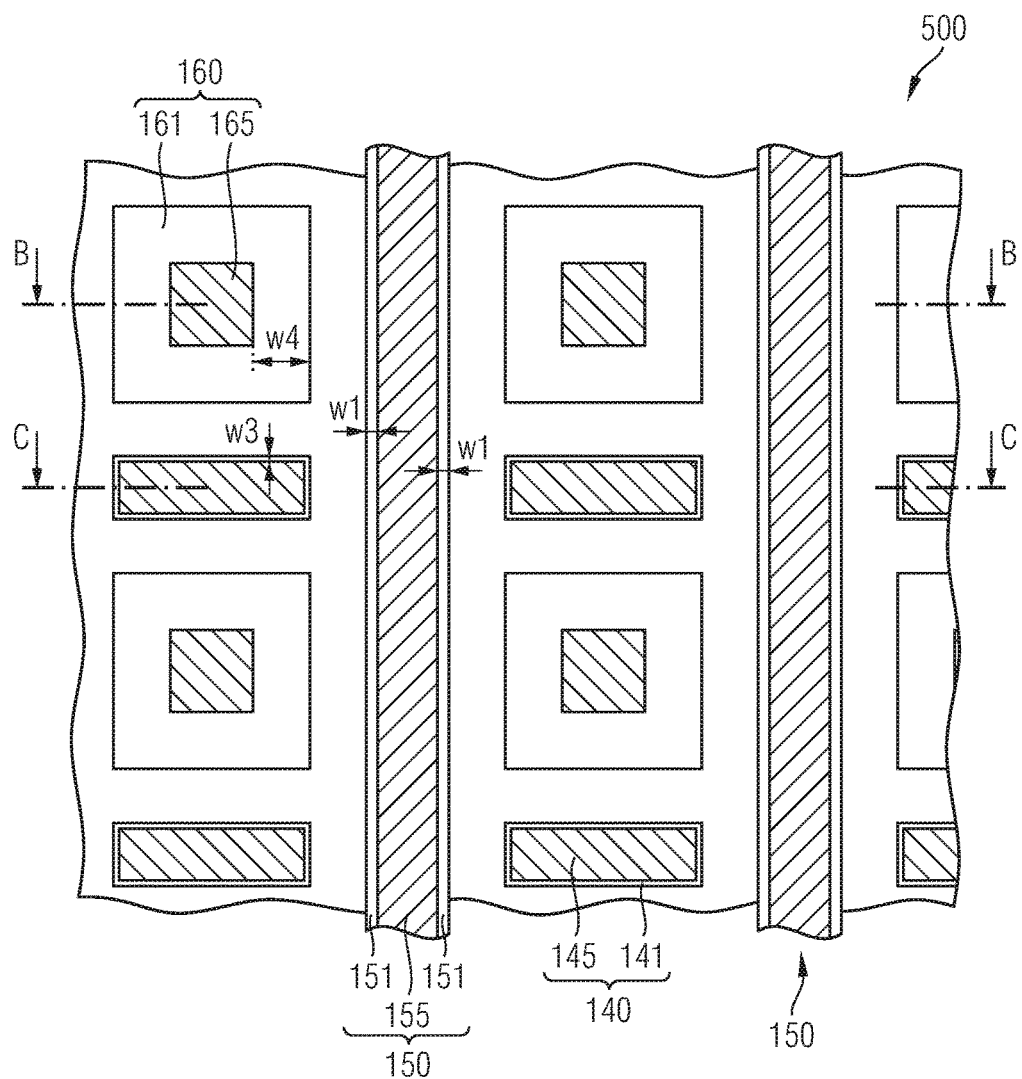
FIG. 5A is a schematic horizontal cross-sectional view of a portion of a semiconductor device in accordance with an embodiment related to MGDs (MOS gated diodes) and needle-shaped field electrode structures alternatingly arranged in lines.
Figure 5B:
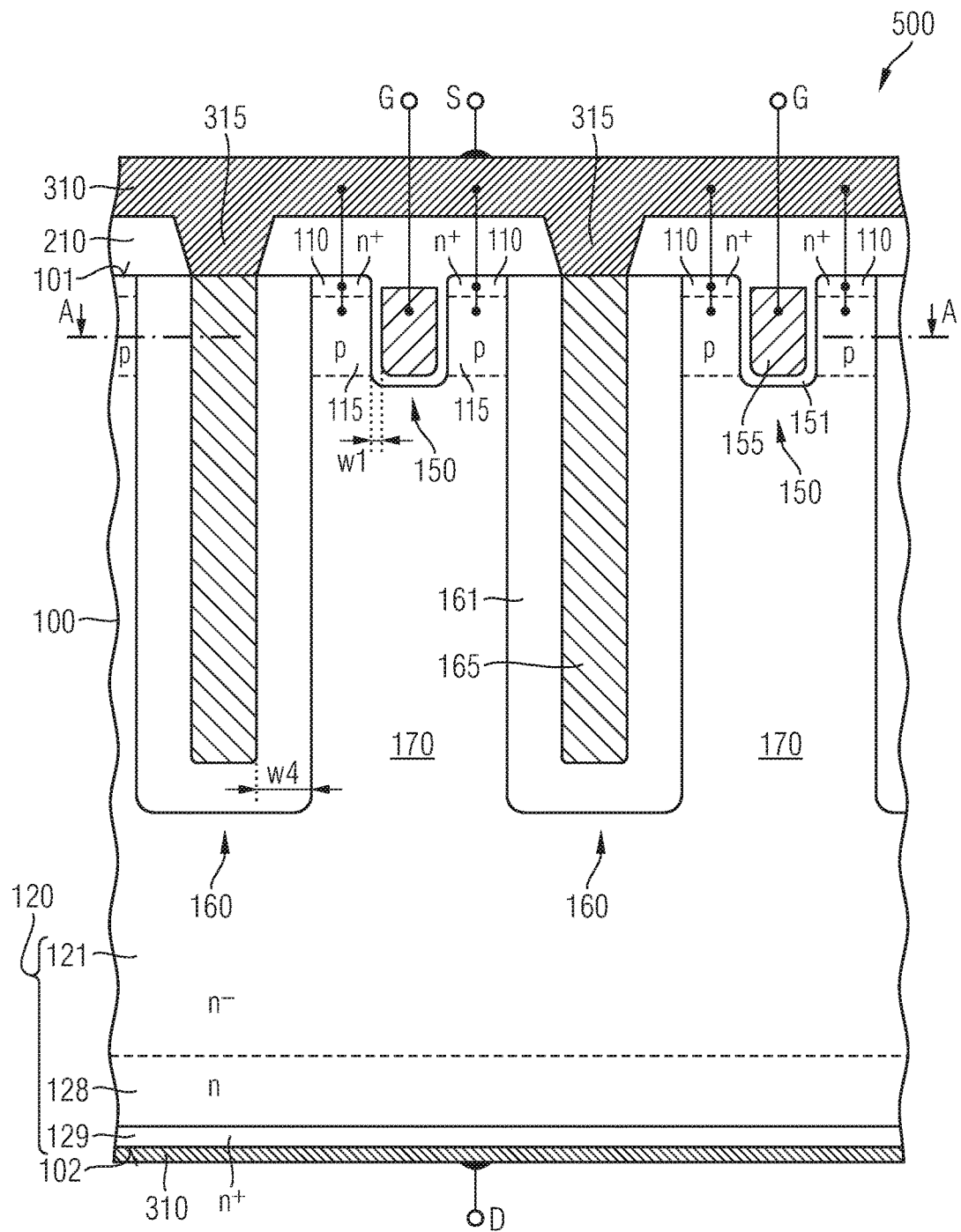
FIG. 5B is a schematic vertical cross-sectional view of the semiconductor device portion of FIG. 5A along line B-B.
Figure 5C:
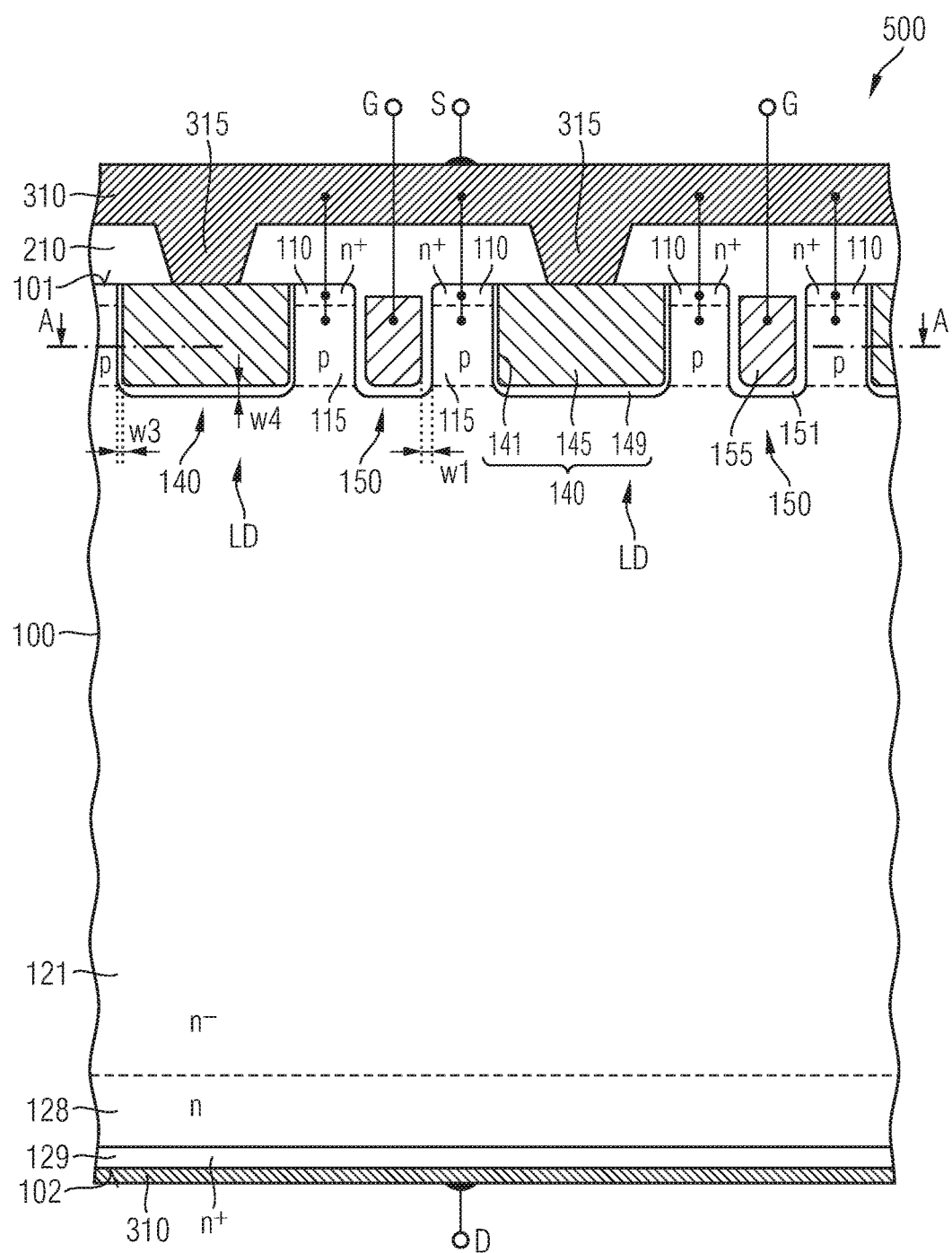
FIG. 5C is a schematic vertical cross-sectional view of the semiconductor device portion of FIG. 5A along line C-C.

The semiconductor device 500 of FIGS. 5A to 5C is based on parallel stripe-shaped gate structures 150. Between each pair of stripe-shaped gate structures 150 field electrode structures 160 are arranged in lines extending parallel to the gate structures 150. Between neighboring field electrode structures 160 MGDs 140 are formed. Each MGD 140 includes a diode electrode 145 and a diode dielectric 141 sandwiched between the diode electrodes 145 and at least the body zones 115. The MGDs 140 may include bottom dielectrics 142 along the interface to the drift zone 121, wherein a thickness w4 of the bottom dielectrics 142 is greater than a thickness w3 of the diode dielectrics 141 to avoid a local breakthrough between the drift. zone 121 and the diode electrode 145 and to reduce the drain-to-source capacity. The thickness w4 of the bottom dielectrics 142 may be approximately equal to a thickness w2 of the field dielectrics 161.

The diode electrodes 145 may consist of or include heavily doped polycrystalline silicon. According to an embodiment the diode electrodes 145 include a metal-containing layer.

The diode dielectrics 141 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof. According to an embodiment, the diode electrodes 145 may comprise the same material(s) and may have the same layer configuration as the gate electrodes 155. Alternatively or in addition, the diode dielectrics 141 may be formed from the same material(s) as the gate dielectrics 151.

The vertical extension of the MGDs 140 is equal to or greater than a distance between the first pn junction pn1 and the first surface 101. According to an embodiment, the MGDs 140 and the gate structures 150 may have the same width and the same vertical extension.

The diode electrodes 145 are electrically connected to the first load electrode 310. For example, contact structures 315 may extend from the first load electrode 310 through openings in the interlayer dielectric 210 down to or into the diode electrodes 145.

A positive potential applied to the first load electrode 310 generates an inversion layer along the diode dielectric 141. The inversion layer bypasses the first pn junction pn1 such that the MGD in substance behaves like a diode.

According to an embodiment, the diode dielectric 141 is thinner than the gate dielectric 151. For example, the thickness w1 of the gate dielectrics 151 is at least 30 nm and the thickness w3 of the diode dielectric 141 is in a range from 3 nm to 15 nm such that the threshold voltage of the MGD 140 is lower than 700 mV. The inversion channels of the MGD 140 convey a unipolar charge carrier current before at the first pn junction pn1 the injection of minority charge carriers starts at a drain-to-source voltage VDS=0.7 V. As a result, the MGDs 140 lower an effective voltage drop across the body junction. The lower voltage drop is also linked to reduced switching losses.

Both the field electrodes 150 and the diode electrodes 145 may be electrically connected with the first load electrode 310 through stripe-shaped contact structures 315 extending parallel to the gate structures 160 in the vertical projection of the field electrode structures 160 and the MGDs 140 or through a plurality of contact structures 315 arranged in lines. The field electrode structures 160 and the MGDs 140 may be spaced from each other as illustrated in FIGS. 5A to 5C. The ratio of the number of field electrode structures 160 to MGDs 140 may be 1:1 as illustrated or any other ratio between 100:1 and 1:100.

Figure 6A:
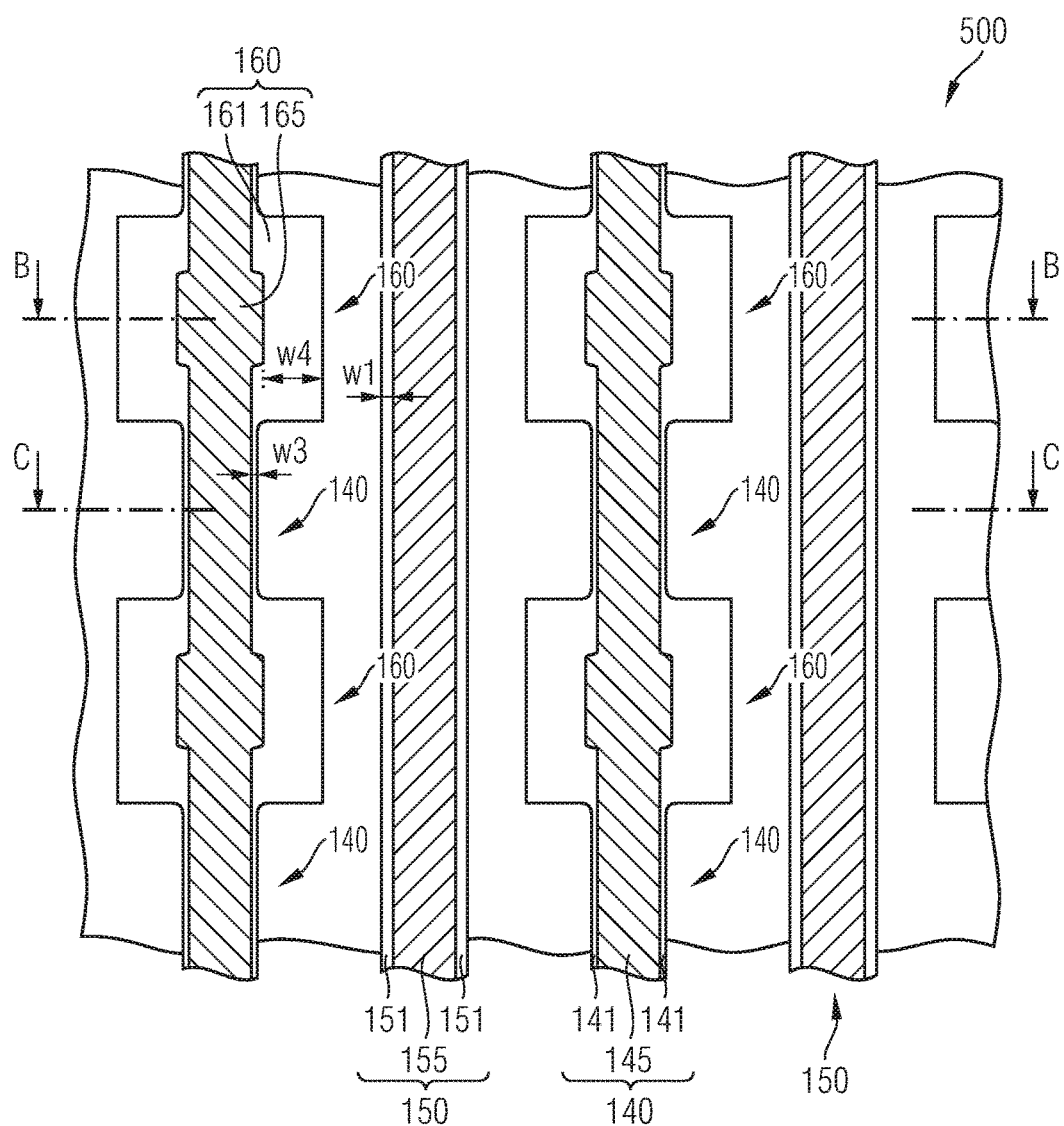
FIG. 6A is a schematic horizontal cross-sectional view of a portion of a semiconductor device in accordance with an embodiment related to MGDs and field electrode structures alternatingly arranged and connected with each other along lines.
Figure 6B:
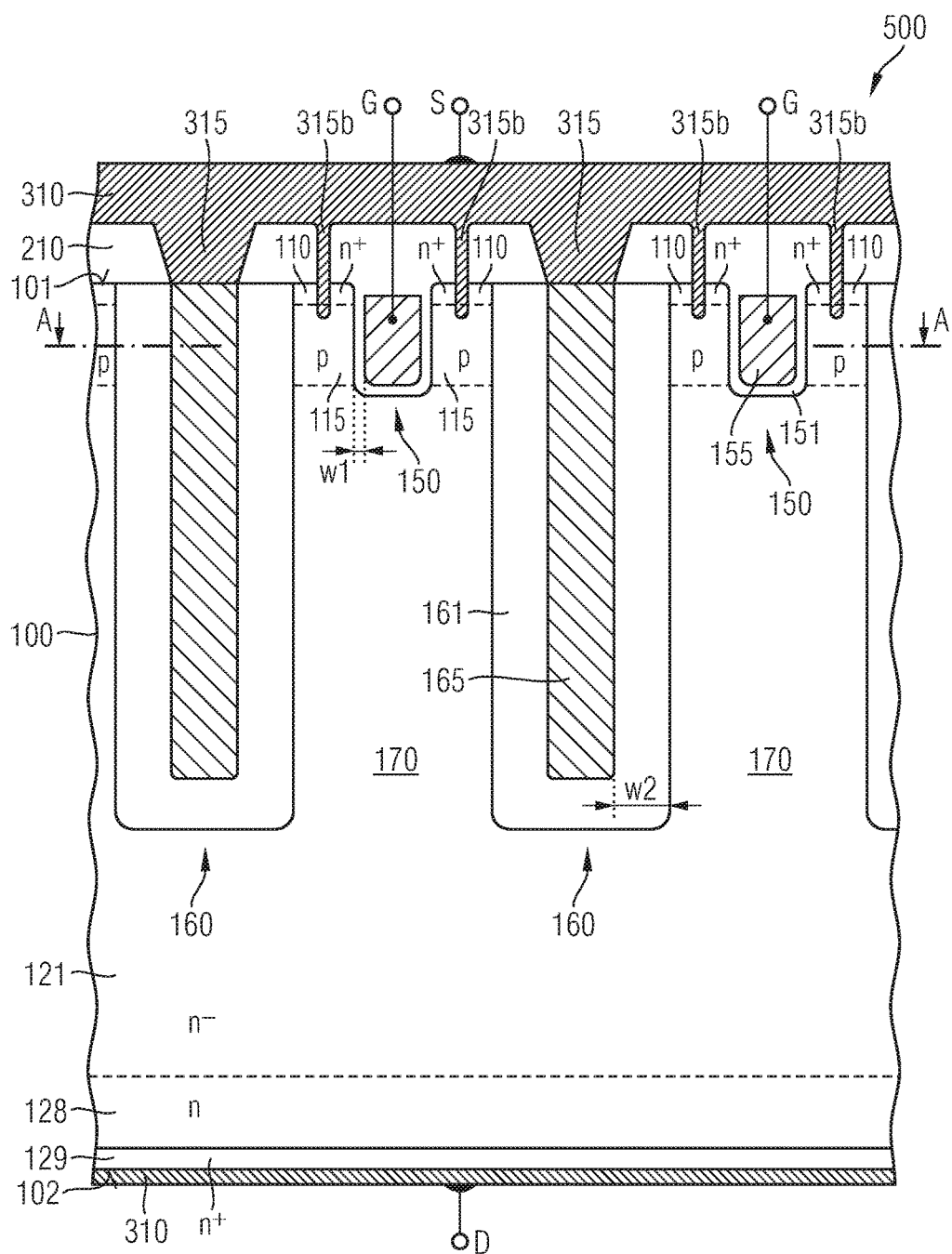
FIG. 6B is a schematic vertical cross-sectional view of the semiconductor device portion of FIG. 6A along line B-B.

In FIGS. 6A to 6C the MGDs 140 and field electrode structures 160 directly adjoin to each other such that the field electrodes 165 and the diode electrodes 145 form contiguous lines parallel to the gate structures 150. The number of contact structures 315 between the first load electrode 310 and the field and diode electrodes 165, 145 may be reduced. For example, contact structures 315 for connecting the field and diode electrodes 165, 145 are exclusively formed in the vertical projection of portions of the field electrodes 165.

Further contact structures 315b may electrically connect the first load electrode 310 with source and body zones 110, 115 approximately in the center of mesa portions between neighboring gate structures 150 and field electrode structures 160 as well as between neighboring gate structures 150 and MGDs 140.

Figure 7A:
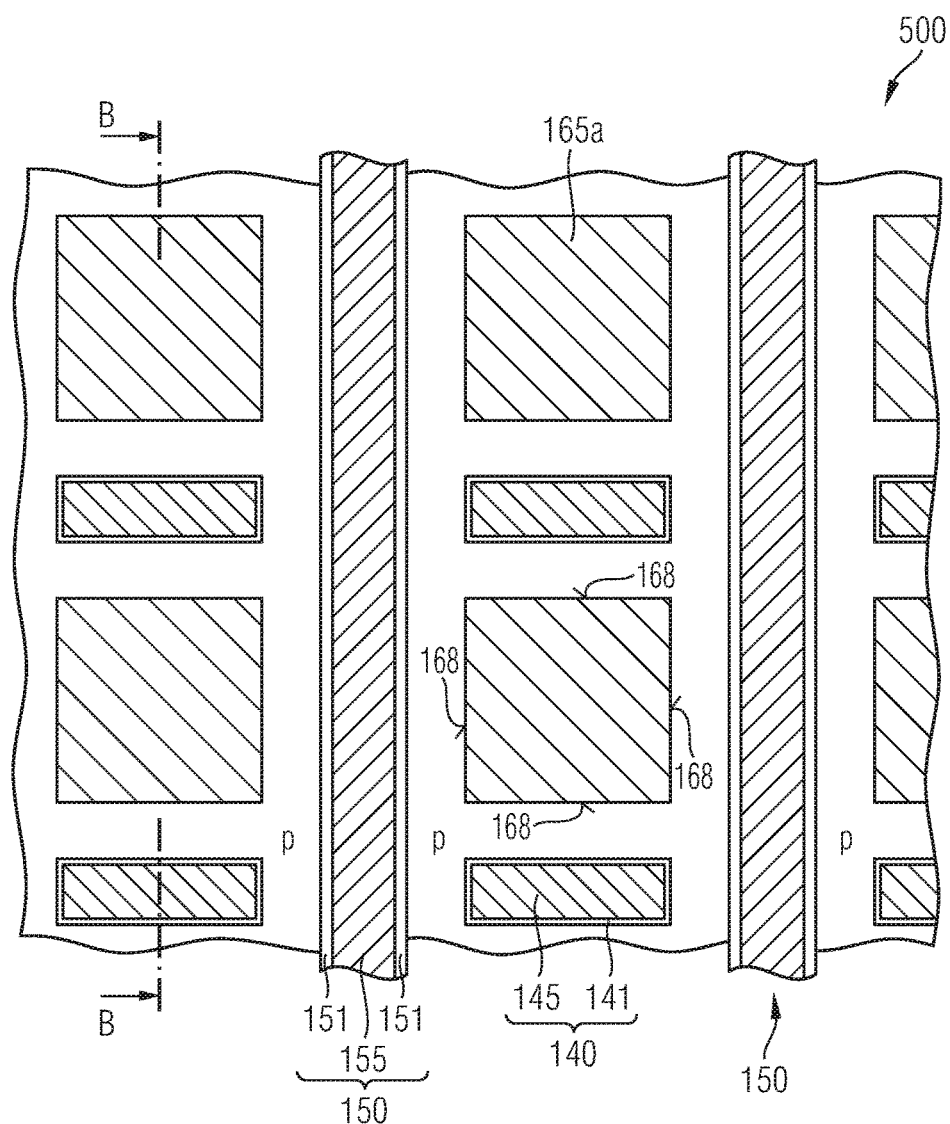
FIG. 7A is a schematic horizontal cross-sectional view of a portion of a semiconductor device in accordance with an embodiment related to MGDs alternatingly arranged with needle-shaped field electrode structures including connection portions.
Figure 7B:
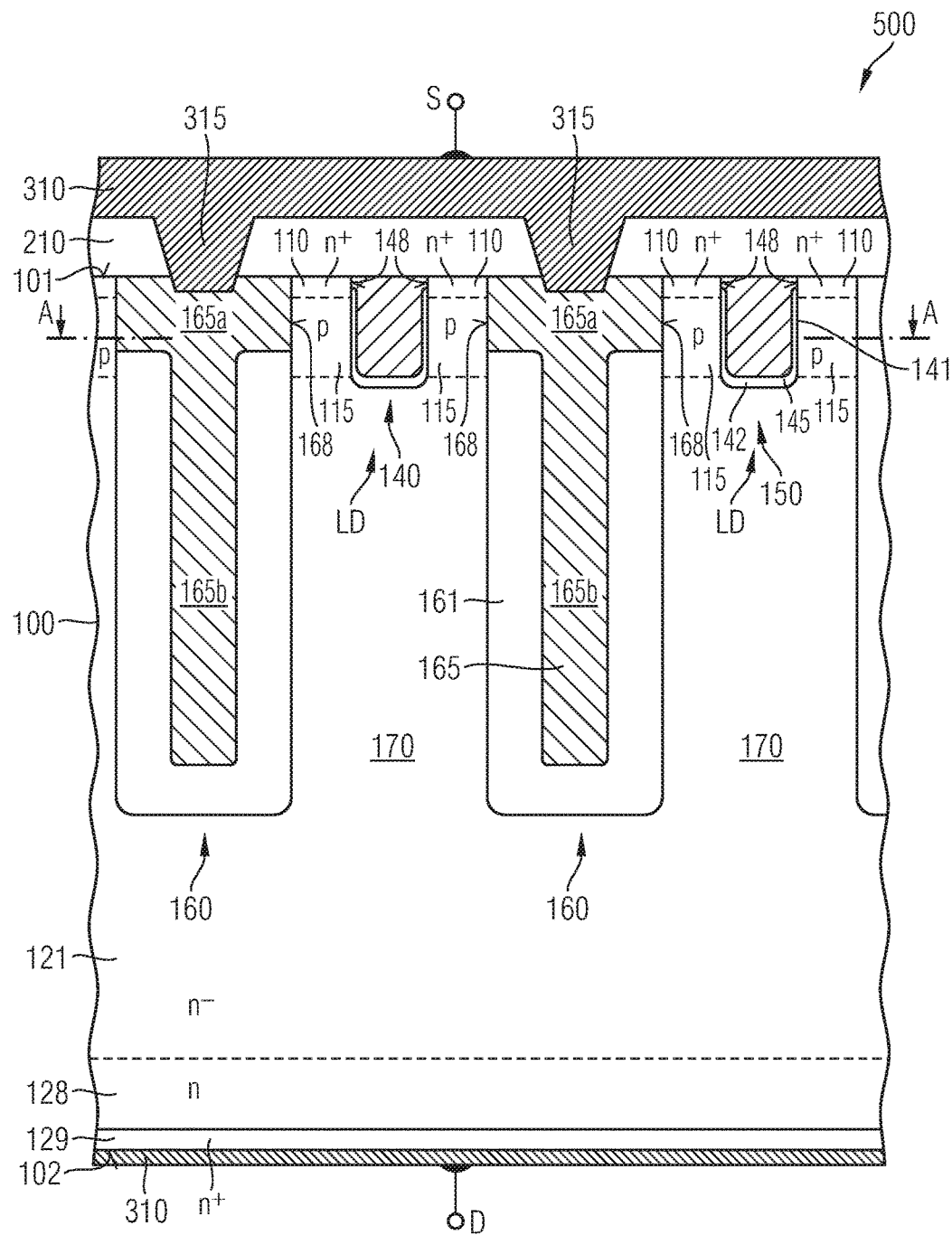
FIG. 7B is a schematic vertical cross-sectional view of the semiconductor device portion of FIG. 7A along line B-B.

In FIGS. 7A to 7B the semiconductor device 500 includes field electrodes 165 with a field portion 165b electrically insulated from the drift zone 121 and a connection portion 165a forming a conductive interface strap 168 with the source zones 110 and body zones 115. The interface strap 168 may be a direct interface between polycrystalline material or partially recrystallized material of the connection portion 165a of the field electrode 165. According to other embodiments, the interface strap 168 may include an interface layer for preventing distortions of the crystal lattice structure of the semiconductor body 100 due to the presence of non-single crystalline material along the interface strap 168. A vertical extension of the connection portion 165a is smaller than a distance between the first pn junction pn1 to the first surface 101 such that the connection portion 165a does not overlap with the drift zone 121.

Contact structures 315 electrically connect the first load electrode 310 with the connection portions 165a. Further contact structures may extend through the interlayer dielectric 210 and may electrically connect the first load electrode 310 with the diode electrode 145. According to the illustrated embodiment, the diode dielectric 141 separates the diode electrodes 145 only from the body zones 115 but is absent in a portion between the first surface 101 and the second pn junction pn2 such that the diode electrode 145 forms a further interface strap 148 with the source zones 110.

The semiconductor devices of FIG. 8A to 8E concern MGDs 140 which diode electrodes 145 are formed in the vertical projection of needle-shaped, spicular field electrode structures 160 at a side oriented to the first surface 101.

The gate structures 150 may be regularly arranged stripes as illustrated in FIG. 8A or may form a grid with the MGDs 140 and field electrode structures 160 arranged in the meshes of the grid. The MGDs 140 may be arranged matrix-like in orthogonal lines and rows or in shifted lines, wherein the MGDs 140 in odd lines are shifted to the MGDs 140 in even lines by a half center-to-center distance between neighboring MGDs 140 along the line direction.

As illustrated in FIGS. 8C to 8F, the diode electrodes 145 are arranged between the field electrode structure 160 and a plane coplanar with the first surface 101. The field dielectrics 161 separate the field electrodes 165 from the drift zone 121. The diode dielectrics 141 may separate the diode electrodes 145 from the body zones 115 in all or at least one horizontal direction(s). Contact structures 315 extend from the first load electrode 310 through openings in the interlayer dielectric 210 to or into the diode electrodes 145. Further contact structures 315b extend from the first load electrode 310 through openings in the interlayer dielectric 210 and the source zones 110 into the body zones 115 on opposing sides of the gate structures 150.

Figure 8B:
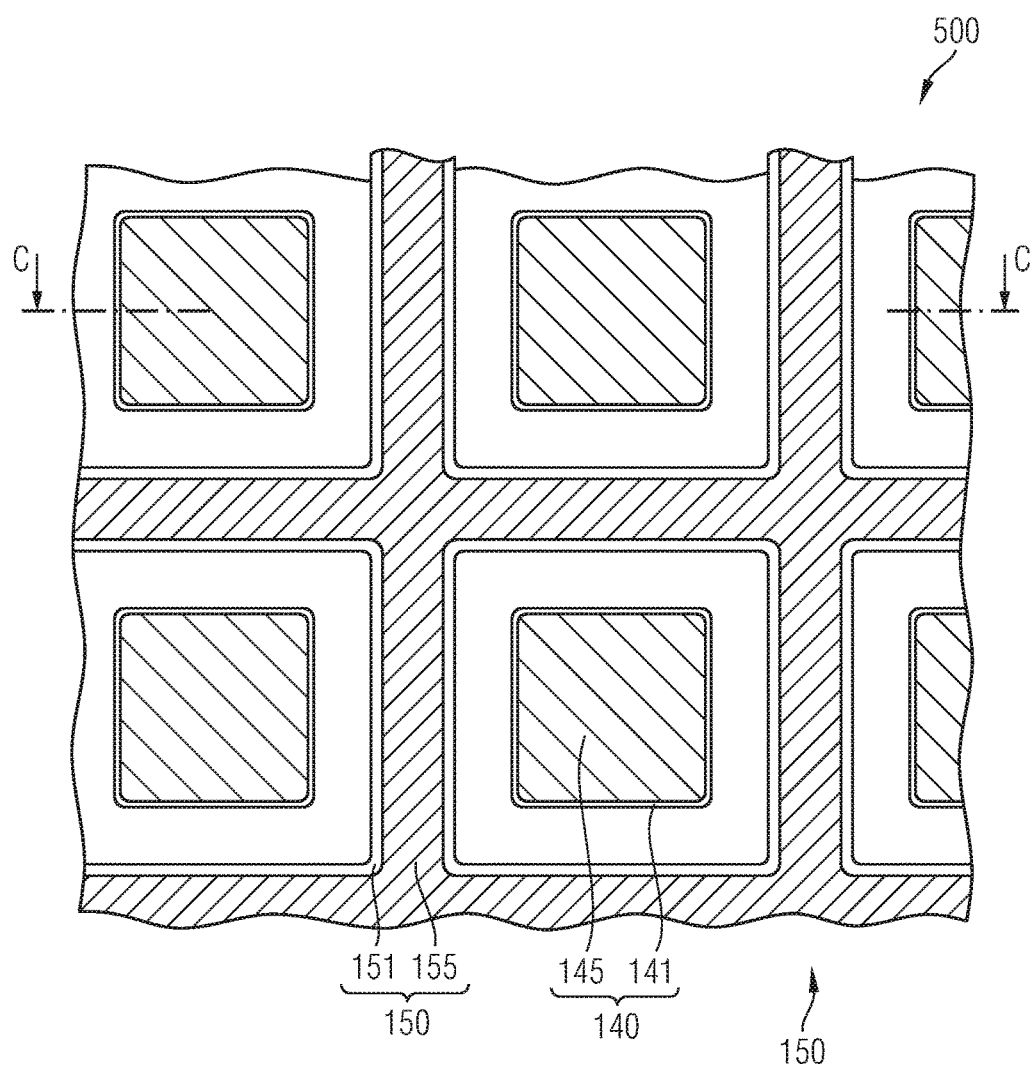
FIG. 8B is a schematic horizontal cross-sectional view of a portion of a semiconductor device in accordance with an embodiment related to grid-shaped gate structures and MGDs with diode electrodes formed in the vertical projection of field electrode structures.
Figure 8C:
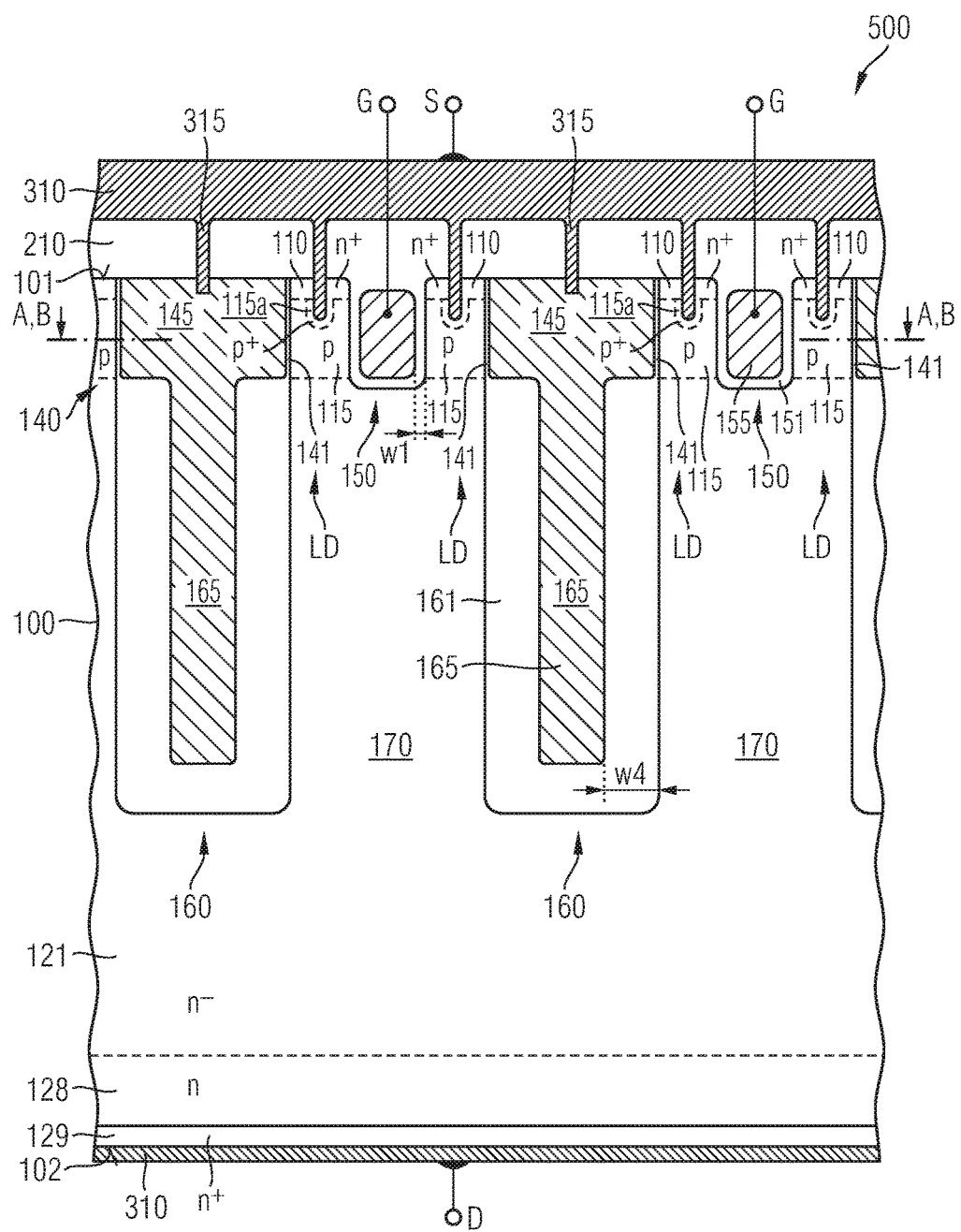
FIG. 8C is a schematic horizontal cross-sectional view of the semiconductor device portions of FIGS. 8A and 8B along lines C-C.
Figure 8D:
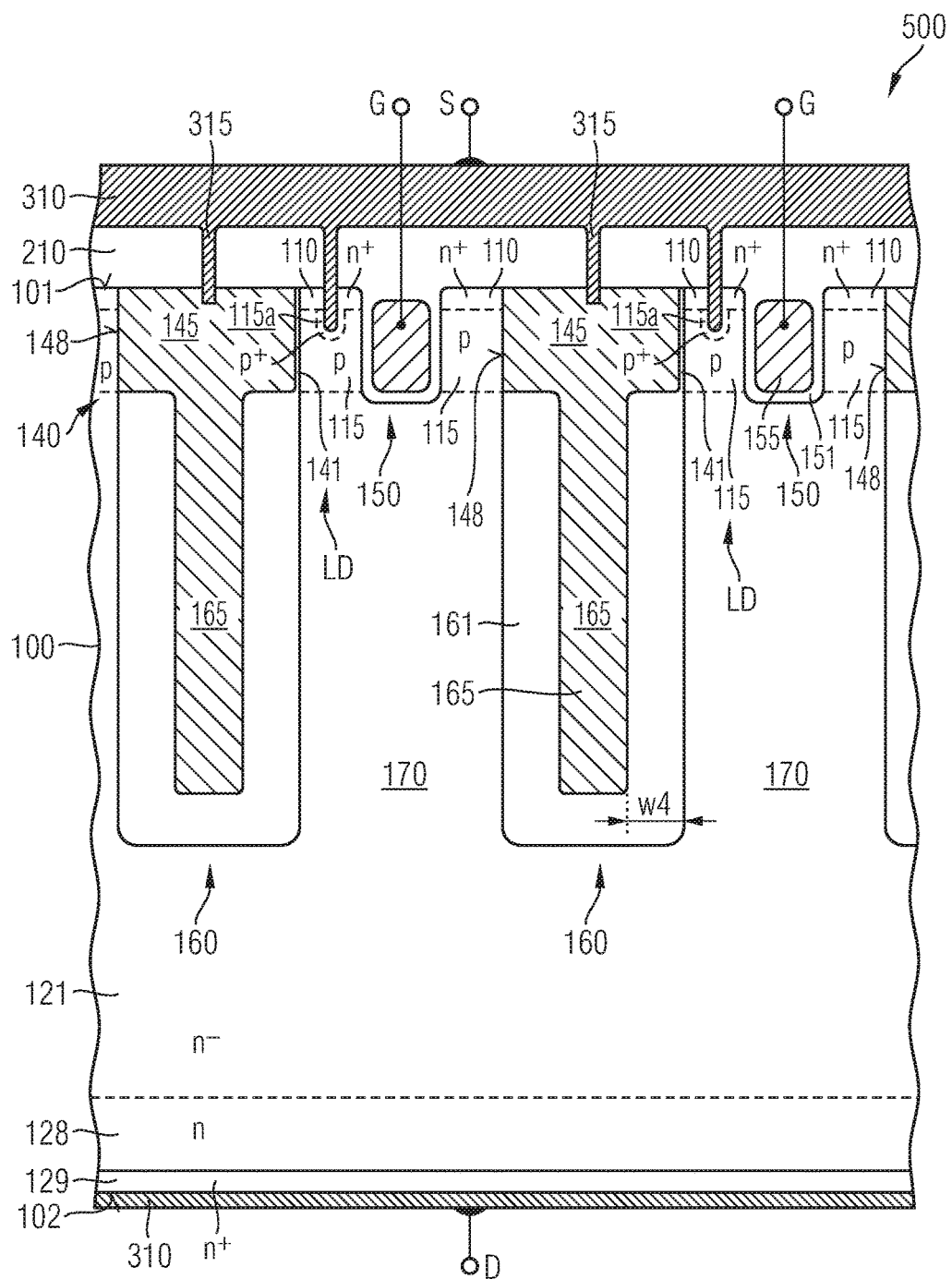
FIG. 8D is a schematic vertical cross-sectional view of a portion of a semiconductor device according to an embodiment related to MGDs with diode electrodes forming direct interfaces with source and body zones.

In FIG. 8D the diode electrodes 145 form conductive interface straps 148 with the source and body zones 110, 115 on at least one of the sides of the MGDs 140. According to the illustrated embodiment, the diode dielectric 141 is formed on a first side facing a first one of the neighboring gate structures 150 and is absent on an opposite second side facing the second neighboring gate structure 150. The area ratio of diode dielectrics 141 to interface straps 148 may be about 1:1 or any other ratio between 1:100 to 100:1, e.g., between 1:10 and 10:1.

Since a contact structure between the first load electrode 310 and the portion of the body zone 115 directly adjoining the interface strap 148 can be omitted, for a given lithography technique and given alignment tolerances, a mesa portion between the interface strap 148 and the neighboring gate structure 150 can be narrower than a mesa portion between the gate structure 150 and the diode dielectric 141.

Figure 8E:
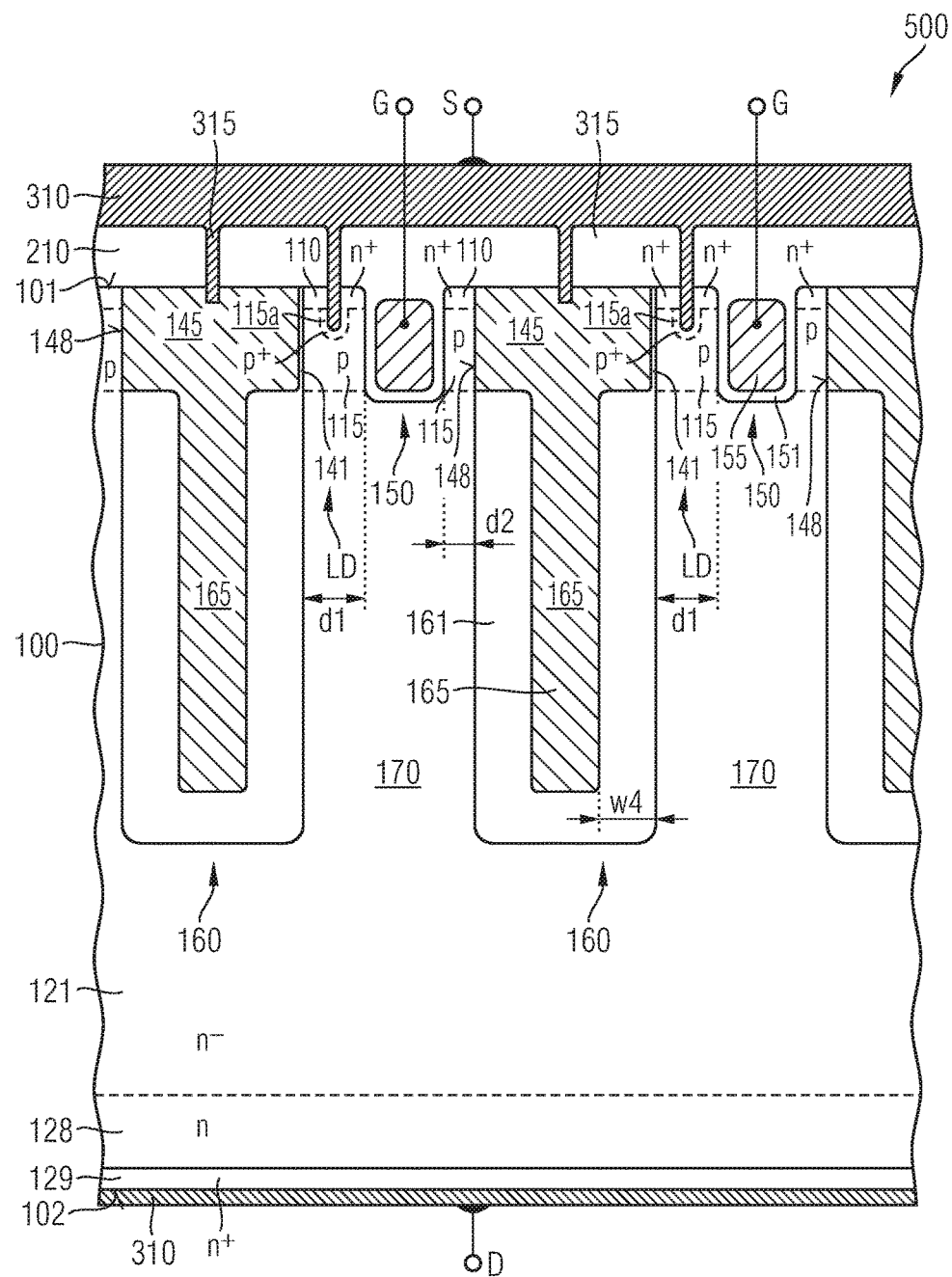
FIG. 8E is a schematic cross-sectional view of a portion of a semiconductor device according to an embodiment related to MGDs with diode electrodes forming direct interfaces with source and body zones and body zones of different width.

FIG. 8E refers to an embodiment with a mesa portion with a first width d1 between the gate structure 150 and the interface strap 148 being narrower than a mesa portion with a second width d2 between the gate structure 150 and the diode dielectric 141.

Figure 9B:
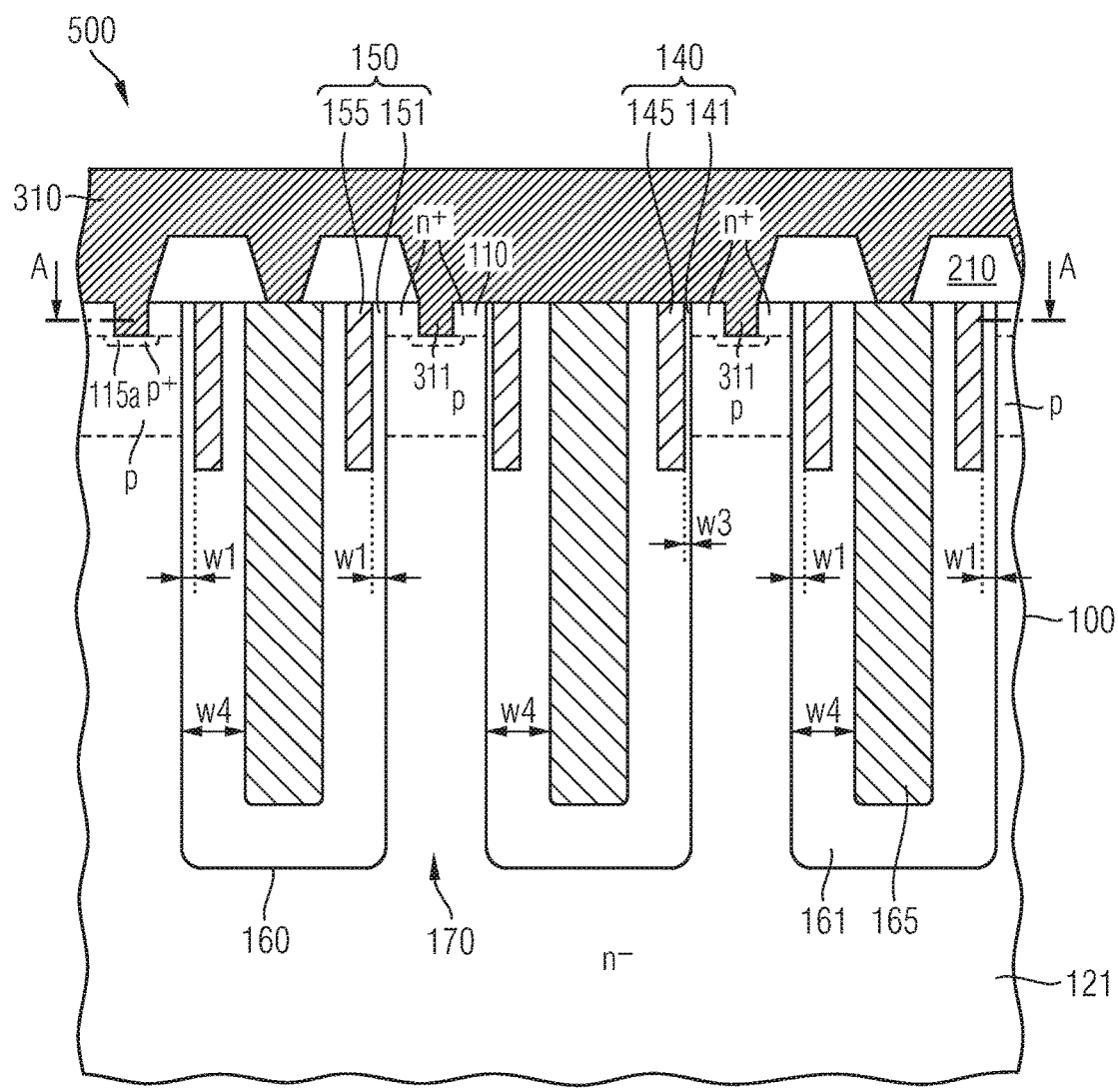
FIG. 9B is a schematic vertical cross-sectional view of the semiconductor device portion of FIG. 9A along line B-B.

While the preceding embodiments refer to embodiments with the gate electrode structures 150 formed in a distance to the field electrode structures 160, FIGS. 9A and 9B refer to an embodiment with both the gate structures 150 and the MGDs 140 formed between the cell mesas 170 and the field electrode structures 160, respectively.

The vertical extension of the gate electrodes 15f and the diode electrodes 145 may be approximately equal. Contact structures 315b extend from the first surface 101 into the semiconductor body 100 to electrically connect the source and body zones 110, 115 with the first load electrode 310.

The ratio of field electrode structures 160 with gate structures 150 to field electrode structures 160 with MGDs 140 may be in range from 1000:1 to 1:10. The illustrated embodiment refers to a ratio of 1:1 with the field electrode structures 160 with gate electrode structures 160 and with MGDs 140 arranged in a checkerboard pattern.

Figure 10:
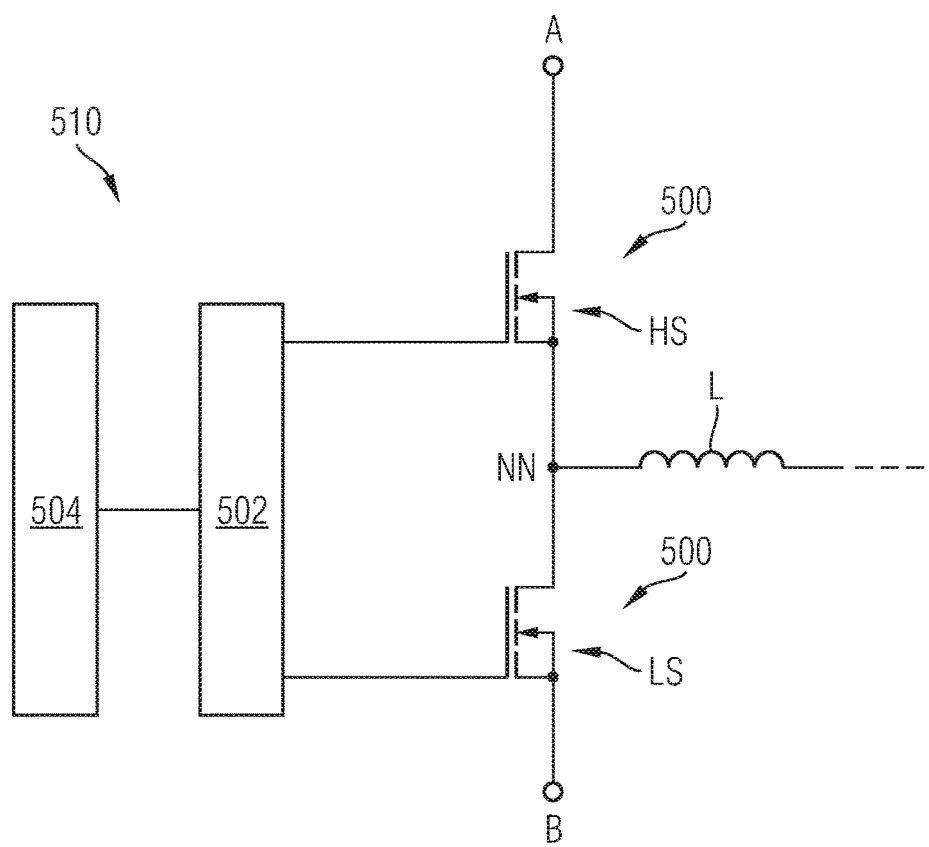
FIG. 10 is a schematic circuit diagram of an electronic assembly including power semiconductor devices according to a further embodiment.

FIG. 10 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two semiconductor switching devices 500 as described above effective as a low side switch LS as well as a high-side switch HS. The semiconductor devices 500 may be IGFETs and the load paths of the two semiconductor devices 500 are electrically arranged in series between a firsts supply terminal A and a second supply terminal B. The supply terminals A, B may supply a DC (direct-current) voltage or an AC (alternating-current) voltage. A network node NN between the two semiconductor devices 500 may be electrically connected to an inductive load, which may be a winding of a transformer or a motor winding, or to a reference potential of an electronic circuit, by way of example. The electronic assembly may further include a control circuit 504 configured to supply a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, the network node NN electrically connected to a motor winding and the supply terminals A, B supplying a DC voltage.

According to another embodiment, the electronic assembly 510 may be a primary side stage of a switched mode power supply with the supply terminals A, B supplying an AC voltage of an input frequency to the electronic circuit 510. The network node NN is electrically connected to a primary winding of a transformer.

The electronic assembly 510 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electronic assembly 510 may be primary side stage of a DC-to-DC. converter, e.g., a power optimizer or a micro-inverter for applications including photovoltaic cells with the supply terminals A, B supplying a DC voltage to the electronic assembly 510 and the network node NN electrically connected to an inductive storage element.

According to another embodiment, the electronic assembly 510 may be a secondary side stage of a DC-to-DC. converter, e.g., a power optimizer or a micro-inverter for applications including photovoltaic cells, wherein the electronic circuit 510 supplies an output voltage to the supply terminals A, B and wherein the network node NN is electrically connected to the inductive storage element.

Figure 11:
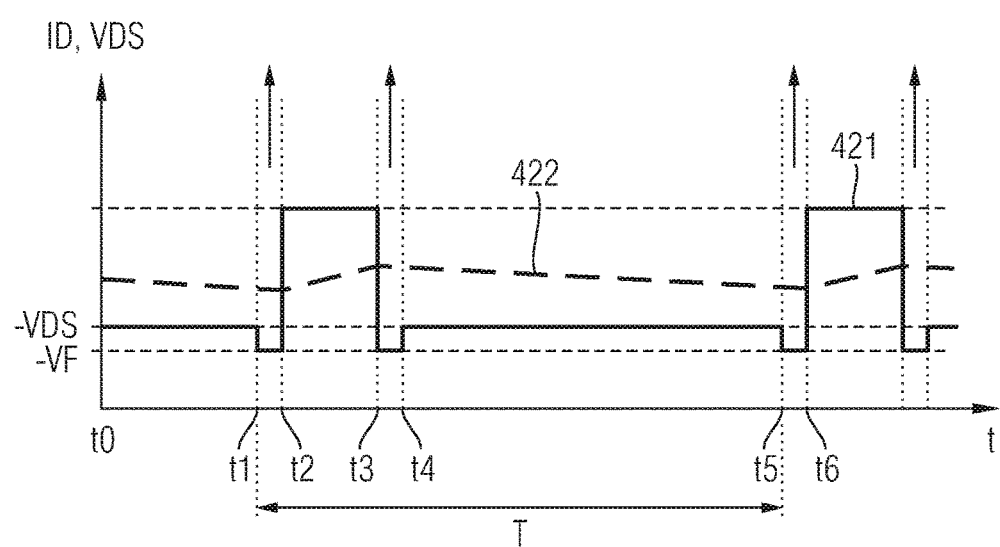
FIG. 11 is a schematic time chart of signals at the electronic assembly of FIG. 10 for illustrating effects of the embodiments.

FIG. 11 shows the switching cycle of the half-bridge circuit of FIG. 10. Line 421 shows the voltage over the low-side MOSFET and line 422 the output current. Between t0 and t1 the low side switch is on and the high side switch is off. Between t1 and t2 both switches are off. Between t2 and t3 the high side switch is on and the low side switch is off. Between t3 and t4 both switches are off and at t4 the low side switch is switched on again.

During phases with both switches off, the current continues to flow. This current is conveyed by the body diodes. With increasing switching frequencies the absolute off times remain approximately equal for reliably avoiding a short circuit condition with both switches on. The contribution of the body diodes to the overall switching losses increases with higher switching frequencies. With low and/or high side switches provided from semiconductor devices according to the embodiments, the switching losses can be significantly reduced.

Figure 12:
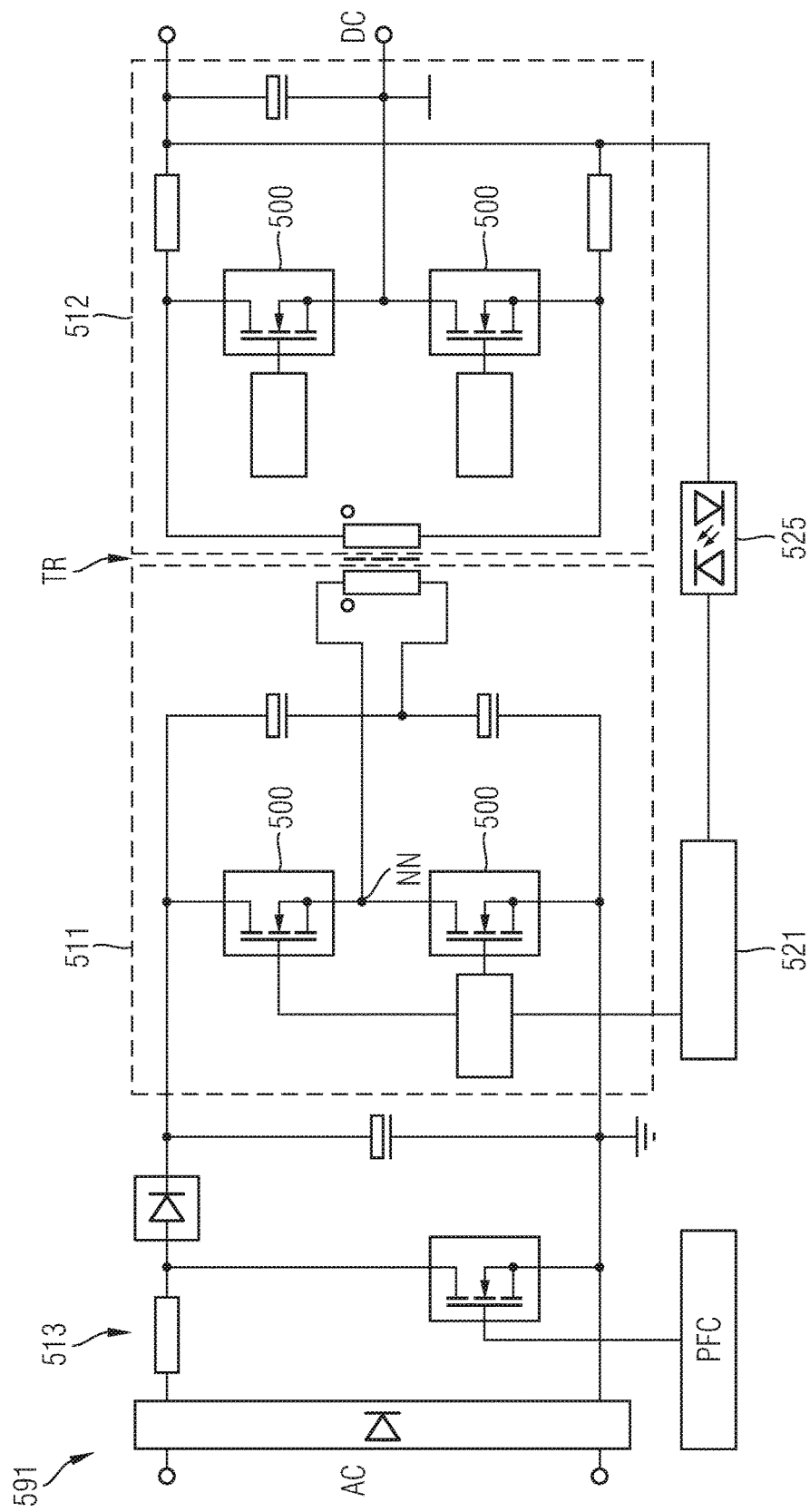
FIG. 12 is a schematic circuit diagram of another electronic assembly including power semiconductor devices in accordance with a further embodiment.

FIG. 12 refers to a switched mode power supply 591 using semiconductor devices 500 as described above in a primary side stage 511 as well as in a synchronous rectifier 512 at the secondary side.

An AC supply voltage is supplied to the primary side stage through a power factor correction unit 513. A pulse width modulation controller 521 controls a gate driver 522 such that two semiconductor devices 500 electrically arranged in series in the primary side stage are alternatively switched on and off. The network node NN between the load paths of the two semiconductor devices 500 is electrically connected to the primary winding of a transformer TR. In the synchronous rectifier 512 at the secondary side, two further semiconductor devices 500 may be electrically arranged in series with respect to each other and, in combination, electrically arranged in parallel to the secondary winding of the transformer TR. Secondary gate drivers 523 alternatingly switch on and off the semiconductor devices 500 of the synchronous rectifier 512. A coupling element 525 that may provide galvanic insulation feeds back the output signal of the synchronous rectifier 512 to the pulse width modulation controller 521 that adapts the timing of the switching cycles in response to varying load conditions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming field electrode structures extending in a direction vertical to a first surface in a semiconductor body;
   forming cell mesas from portions of the semiconductor body between the field electrode structures, including zones forming first pn junctions with a drift zone;
   forming gate structures between the field electrode structures and configured to control a current flow through the body zones; and
   forming auxiliary node structures with a forward voltage lower than the first pn junctions and electrically connected in parallel with the first pn junctions, wherein semiconducting portions of the auxiliary diode structures are formed in the cell mesas.

2. The method of claim 1, wherein a first lateral extension of the field electrode structures along a first horizontal direction parallel to the first surface is at most three times as large as a second lateral extension of the field electrode structures along a second horizontal direction orthogonal to the first horizontal direction and parallel to the first surface.

3. The method of claim 1, wherein forming the auxiliary diode structures comprises forming Schottky contacts.

4. The method of claim 3, wherein forming the Schottky contacts comprises forming the Schottky contacts at interfaces between the drift zone and conductive structures, each conductive structure extending between one of the gate structures and one of the field electrode structures from the first surface into the semiconductor body.

5. The method of claim 4, wherein each conductive structure directly adjoins the corresponding field electrode structure.

6. The method of claim 4, wherein forming the field electrode structures comprises forming a plurality of field electrodes and a field dielectric, separating the field electrodes from the semiconductor body, and wherein each conductive structure is sandwiched between one of the cell mesas and one of the field dielectrics.

7. The method of claim 4, wherein the conductive structures separate the field electrode structures from the first surface.

8. The method of claim 4, wherein the conductive structures are spaced from the field electrode structures and extend through the body zones.

9. The method of claim 3, wherein forming the gate structures comprises forming the gate structures between the cell mesas and the field electrode structures, and wherein forming the Schottky contacts comprises forming the Schottky contacts between the cell mesas and the field electrode structures.

10. The method of claim 9, wherein forming the Schottky contacts comprises forming the Schottky contacts at interfaces between the drift zone and the conductive structures, each conductive structure extending from the first surface into a field dielectric of one of the field electrode structures and directly adjoining the adjoining cell mesa.

11. The method of claim 1, wherein forming the auxiliary diode structures comprises forming MOS gated diodes with diode electrodes electrically connected to source zones and that form second pn junctions with the body zones, and diode dielectrics sandwiched between the diode electrodes and the body zones.

12. The method of claim 11, wherein a vertical extension of the MOS gated diodes with respect to the first surface is equal to or greater than a vertical extension of the gate structures.

13. The method of claim 11, wherein forming the gate structures comprises forming the gate structures as stripes, wherein forming the field electrode structures comprises forming the field electrode structures in lines arranged between the gate structures, and wherein forming the MOS gated diodes comprises forming the MOS gated diodes between neighboring field electrode structures of the same line.

14. The method of claim 13, wherein forming the field electrode structures comprises forming a plurality of field electrodes and a field dielectric separating the field electrodes from the drift zone, and wherein the field electrodes and the diode electrodes form contiguous lines.

15. The method of claim 13, wherein forming the field electrode structures comprises forming a plurality of field electrodes and a field dielectric separating the field electrodes and the drift zone, and wherein a connection portion of the field electrode directly adjoins neighboring source and body zones.

16. The method of claim 11, wherein forming the gate structures comprises forming the gate structures as stripes, wherein forming the field electrode structures comprises forming the field electrode structures in lines arranged between the gate structures, and wherein forming the MOS gated diodes comprises forming the MOS gated diodes in the vertical projection of the field electrode structures between a plane coplanar with the first surface and the field electrode structures.

17. The method of claim 11, wherein forming the gate structures comprises forming the gate structures between the cell mesas and the field electrode structures, and wherein forming the MOS gated diodes comprises forming the MOS gated diodes between the cell mesas and the field electrode structures.

18. A method of controlling an electronic assembly that comprises a first and a second semiconductor device each having field electrode structures extending in a direction vertical to a first surface in a semiconductor body, cell mesas formed from portions of the semiconductor body between the field electrode structures and including body zones forming first pn junctions with a drift zone, gate structures formed between the field electrode structures and configured to control a current flow through the body zones, and auxiliary diode structures with a forward voltage lower than the first pn junctions and electrically connected in parallel with the first pn junctions, wherein semiconducting portions of the auxiliary diode structures are formed in the cell mesas, the method comprising:
   electrically connecting a first supply terminal to a load path of the first semiconductor device;
   electrically connecting a second supply terminal to a load path of the second semiconductor device;
   electrically connecting a network node between the first and second semiconductor devices to an inductive load; and
   supplying a control signal for alternately switching on and off the first and second semiconductor devices.

19. A method of controlling a switched mode power supply having a primary side coupled to a secondary side by a transformer, the primary side including a power stage having a first and a second semiconductor device electrically arranged in series with one another, the secondary side including a synchronous rectifier having a third and a fourth semiconductor device electrically arranged in series with one another and in parallel with a secondary winding of the transformer, wherein each semiconductor device has field electrode structures extending in a direction vertical to a first surface in a semiconductor body, cell mesas formed from portions of the semiconductor body between the field electrode structures and including body zones forming first pn junctions with a drift zone, gate structures formed between the field electrode structures and configured to control a current flow through the body zones, and auxiliary diode structures with a forward voltage lower than the first pn junctions and electrically connected in parallel with the first pn junctions, wherein semiconducting portions of the auxiliary diode structures are formed in the cell mesas, the method comprising:

electrically connecting a network node between load paths of the first and second semiconductor devices to a primary winding of the transformer;

supplying an AC voltage to the primary side power stage;

controlling the first and second semiconductor devices by pulse width modulation control such that the first and second semiconductor devices are alternatively switched on and off; and alternatively switching on and off the third and fourth semiconductor devices.

20. The method of claim 19, further comprising adapting timing of the switching of the first and second semiconductor devices in response to varying load conditions.

\* \* \* \* \*